(12) United States Patent
Kang et al.

(10) Patent No.: US 12,224,308 B2
(45) Date of Patent: Feb. 11, 2025

(54) DISPLAY DEVICE AND TILED DISPLAY INCLUDING THE SAME

(71) Applicant: Samsung Display Co., LTD., Yongin-si (KR)

(72) Inventors: Seung Jae Kang, Anyang-si (KR); Jae Gil Lee, Yongin-si (KR); Jae Seob Chung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 400 days.

(21) Appl. No.: 17/701,250

(22) Filed: Mar. 22, 2022

(65) Prior Publication Data
US 2023/0005986 A1    Jan. 5, 2023

(30) Foreign Application Priority Data
Jul. 5, 2021   (KR) ........................ 10-2021-0087687

(51) Int. Cl.
*H01L 27/15*    (2006.01)
(52) U.S. Cl.
CPC ................................. *H01L 27/156* (2013.01)
(58) Field of Classification Search
CPC . H01L 27/156; H01L 25/0753; H01L 25/167; H01L 27/153; G09G 2300/026; G09G 2300/04; G09G 2300/0413; G09G 2300/0439; G09G 2310/0232; G09G 3/32; H10K 59/18; H10K 59/35
See application file for complete search history.

(56) References Cited

U.S. PATENT DOCUMENTS

2020/0212134 A1*   7/2020  Lee ........................ H10K 59/35

FOREIGN PATENT DOCUMENTS

| KR | 2016-0099999 A | 8/2016 |
| KR | 2018-0015553 A | 2/2018 |

* cited by examiner

*Primary Examiner* — Mohammad A Rahman
(74) *Attorney, Agent, or Firm* — Womble Bond Dickinson

(57) ABSTRACT

A display device and a tiled display including the same are provided. The display device includes a bottom plate, and a display panel including an active area on the bottom plate and including a plurality of pixels, and a plurality of dummy areas near the active area and including a plurality of dummy pixels, wherein the plurality of dummy pixels is on at least one side surface of the bottom plate, wherein the plurality of pixels includes a first sub-pixel, a second sub-pixel, and a third sub-pixel configured to emit lights of different colors, and wherein the plurality of dummy pixels is configured to emit light of a same color as one of the first sub-pixel, the second sub-pixel, and the third sub-pixel.

20 Claims, 28 Drawing Sheets

DISPLAY DEVICE AND TILED DISPLAY INCLUDING THE SAME

CROSS-REFERENCE TO RELATED APPLICATION

This application claims priority to and the benefit of Korean Patent Application No. 10-2021-0087687 filed on Jul. 5, 2021, in the Korean Intellectual Property Office, the entire disclosure of which is incorporated by reference herein.

BACKGROUND

1. Field

The present disclosure relates to a display device and a tiled display having the same.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions. Display devices may be flat panel display devices such as a liquid-crystal display device, a field emission display device, and an organic light-emitting display device. Among such flat panel display devices, a light-emitting display device includes a light-emitting element that can emit light on its own, so that each of the pixels of the display panel can emit light by themselves. Accordingly, a light-emitting display device can display images without a backlight unit that supplies light to the display panel.

For a display device having a large screen, a great amount of pixels are disposed, and thus the defect rate of light-emitting elements may increase while productivity or reliability may deteriorate. To overcome such issues, a tiled display can provide a large screen by connecting a plurality of display devices having a relatively small size. Such a tiled display may include boundary areas between a plurality of display devices, which are referred to as seams because there are the non-display areas or bezel areas between the plurality of display devices adjacent to each other. When a single image is displayed on the full screen, such boundary areas between the display devices result in visible seams, hindering a viewer from getting immersed into the image.

SUMMARY

Aspects and features of embodiments of the present disclosure provide a display device that may improve the display quality by way of suppressing the outermost areas of display devices or boundary areas of a tiled display from being seen, and a tiled display including the same.

It should be noted that aspects and features of embodiments of the present disclosure are not limited to the above-mentioned aspects and features; and other aspects and features of embodiments of the present disclosure will be apparent to those skilled in the art from the following descriptions.

According to one or more embodiments of the present disclosure, a display device includes a bottom plate, and a display panel including an active area on the bottom plate and including a plurality of pixels, and a plurality of dummy areas near the active area and including a plurality of dummy pixels, wherein the plurality of dummy pixels is on at least one side surface of the bottom plate, wherein the plurality of pixels includes a first sub-pixel, a second sub-pixel, and a third sub-pixel configured to emit lights of different colors, and wherein the plurality of dummy pixels is configured to emit light of a same color as one of the first sub-pixel, the second sub-pixel, and the third sub-pixel.

In one or more embodiments, the plurality of dummy areas includes a first dummy area at one side of the active area and a second dummy area at an opposite side of the active area, wherein the first dummy area includes a plurality of first dummy pixels from among the plurality of dummy pixels, and wherein the second dummy area includes a plurality of second dummy pixels from among the plurality of dummy pixels.

In one or more embodiments, the plurality of first dummy pixels is adjacent to the first sub-pixel and configured to emit light of the same color as that of the first sub-pixel, and wherein the plurality of second dummy pixels is adjacent to the third sub-pixel and configured to emit light of the same color as that of the third sub-pixel.

In one or more embodiments, the plurality of first dummy pixels has a same shape and a same size as the first sub-pixel, and wherein the plurality of second dummy pixels has a same shape and a same size as the third sub-pixel.

In one or more embodiments, the first sub-pixel, the second sub-pixel, and the third sub-pixel are arranged along a first direction, and wherein the plurality of first dummy pixels and the plurality of second dummy pixels are arranged along the first direction.

In one or more embodiments, the bottom plate includes an upper surface, a plurality of side surfaces, and a plurality of edge surfaces connecting the upper surface with the plurality of side surfaces, wherein the plurality of side surfaces includes a first side surface corresponding to the first dummy area and a second side surface corresponding to the second dummy area, and wherein the plurality of edge surfaces includes a first edge surface corresponding to the first dummy area and a second edge surface corresponding to the second dummy area.

In one or more embodiments, the plurality of first dummy pixels is on the first edge surface and the first side surface, and wherein the plurality of second dummy pixels is on the second edge surface and the second side surface.

In one or more embodiments, the plurality of first dummy pixels and the plurality of second dummy pixels are arranged along a first direction, and wherein a number of the plurality of first dummy pixels on the first side surface is different from a number of the plurality of second dummy pixels on the second side surface.

In one or more embodiments, the plurality of first dummy pixels and the plurality of second dummy pixels are arranged along a first direction, and wherein a number of the plurality of first dummy pixels on the first side surface is equal to a number of the plurality of second dummy pixels on the second side surface.

According to one or more embodiments of the present disclosure, a display device includes a bottom plate, and a display panel including an active area on the bottom plate and including a plurality of pixels, and a plurality of dummy areas near the active area and including a plurality of dummy pixels, wherein the plurality of dummy pixels is on at least one side surface of the bottom plate, wherein the plurality of pixels includes a first sub-pixel, a second sub-pixel, and a third sub-pixel arranged along a first direction and configured to emit lights of different colors, and wherein the plurality of dummy pixels includes a first dummy pixel configured to emit light of a same color as the first sub-pixel, a second dummy pixel configured to emit light of a same color as the second sub-pixel, and a third dummy pixel configured to emit light of a same color as the third sub-pixel.

In one or more embodiments, the display panel includes a pad area on one side of the active area, wherein the plurality of dummy areas includes a first dummy area adjacent to the pad area with the active area therebetween and a second dummy area adjacent to the pad area, and wherein the first dummy pixel, the second dummy pixel, and the third dummy pixel are located in each of the first dummy area and the second dummy area.

In one or more embodiments, the first dummy pixel, the second dummy pixel, and the third dummy pixel extend in a second direction crossing the first direction and are sequentially arranged along the first direction.

In one or more embodiments, a length of the first dummy pixel in the second direction is larger than a length of the first dummy pixel in the second direction, and wherein a length of each of the second dummy pixel and the third dummy pixel in the second direction is equal to a length of the first dummy pixel in the second direction.

In one or more embodiments, the display device further includes a fourth dummy pixel between the first sub-pixel and the first dummy pixel, a fifth dummy pixel between the second sub-pixel and the second dummy pixel, and a sixth dummy pixel between the third sub-pixel and the third dummy pixel, wherein the fourth dummy pixel has a same size and is configured to emit light of a same color as the first sub-pixel, wherein the fifth dummy pixel has a same size and configured to emit light of a same color as the second sub-pixel, and wherein the sixth dummy pixel has a same size and configured to emit light of a same color as the third sub-pixel.

According to one or more embodiments of the present disclosure, a tiled display includes a first display device and a second display device adjacent to each other, wherein each of the first display device and the second display device includes a bottom plate, and a display panel including an active area on the bottom plate and including a plurality of pixels, and a plurality of dummy areas near the active area and including a plurality of dummy pixels, wherein the plurality of dummy pixels is on at least one side surface of the bottom plate, wherein the plurality of pixels includes a first sub-pixel, a second sub-pixel, and a third sub-pixel configured to emit lights of different colors, and wherein the plurality of dummy pixels is configured to emit light of a same color as one of the first sub-pixel, the second sub-pixel, and the third sub-pixel.

In one or more embodiment, the plurality of dummy areas includes a first dummy area on one side of the active area and a second dummy area on an opposite side of the active area, wherein the first dummy area includes a plurality of first dummy pixels, wherein the second dummy area includes a plurality of second dummy pixels, and wherein the plurality of second dummy pixels of the first display device faces the plurality of first dummy pixels of the second display device.

In one or more embodiments, the tiled display further includes a boundary area between the first display device and the second display device, wherein the plurality of second dummy pixels of the first display device and the plurality of first dummy pixels of the second display device are adjacent to the boundary area.

In one or more embodiments, the bottom plate includes an upper surface, a plurality of side surfaces, and a plurality of edge surfaces connecting the upper surface with the plurality of side surfaces, wherein the plurality of side surfaces includes a first side surface corresponding to the first dummy area and a second side surface corresponding to the second dummy area, wherein the plurality of edge surfaces includes a first edge surface corresponding to the first dummy area and a second edge surface corresponding to the second dummy area, and wherein the second side surface of the first display device and the first side surface of the second display device face each other in the boundary area.

In one or more embodiments, the plurality of second dummy pixels is on the second edge surface and the second side surface in the first display device, wherein the plurality of first dummy pixels is on the first edge surface and the first side surface in the second display device, and wherein a number of the plurality of second dummy pixels of the first display device is equal to a number of the plurality of second dummy pixels of the first display device.

In one or more embodiments, the plurality of second dummy pixels of the first display device is configured to emit light of a same color as that of the third sub-pixel, and wherein the plurality of first dummy pixels of the second display device is configured to emit light of a same color as that of the first sub-pixels.

According to one or more embodiments of the present disclosure, a plurality of dummy pixels is included in a dummy area of a display device, so that the luminance at the border of the display device or a boundary area of a tiled display may be increased, thereby suppressing the border or the boundary area from being noticed by a user. By doing so, the display quality of the display devices may be improved.

In addition, in the display device and the tiled display including the display device, a display panel is coupled with a bottom plate, so that the rigidity of the display device may be enhanced.

In addition, in the display device and the tiled display including the same, the display panel is disposed such that its side surfaces face downward, it is possible to prevent light leakage through the side surfaces of the substrate.

In addition, in the display device and the tiled display including the same, the display panels of the display devices are disposed adjacent to the boundary area, and thus the width of the boundary area may be reduced. In this manner, it is possible to suppress the boundary area from being noticed.

It should be noted that effects, aspects, and features of the present disclosure are not limited to those described above and other effects, aspects, and features of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, one or more embodiments of the present disclosure will be described with reference to the accompanying drawings.

Figure 1:
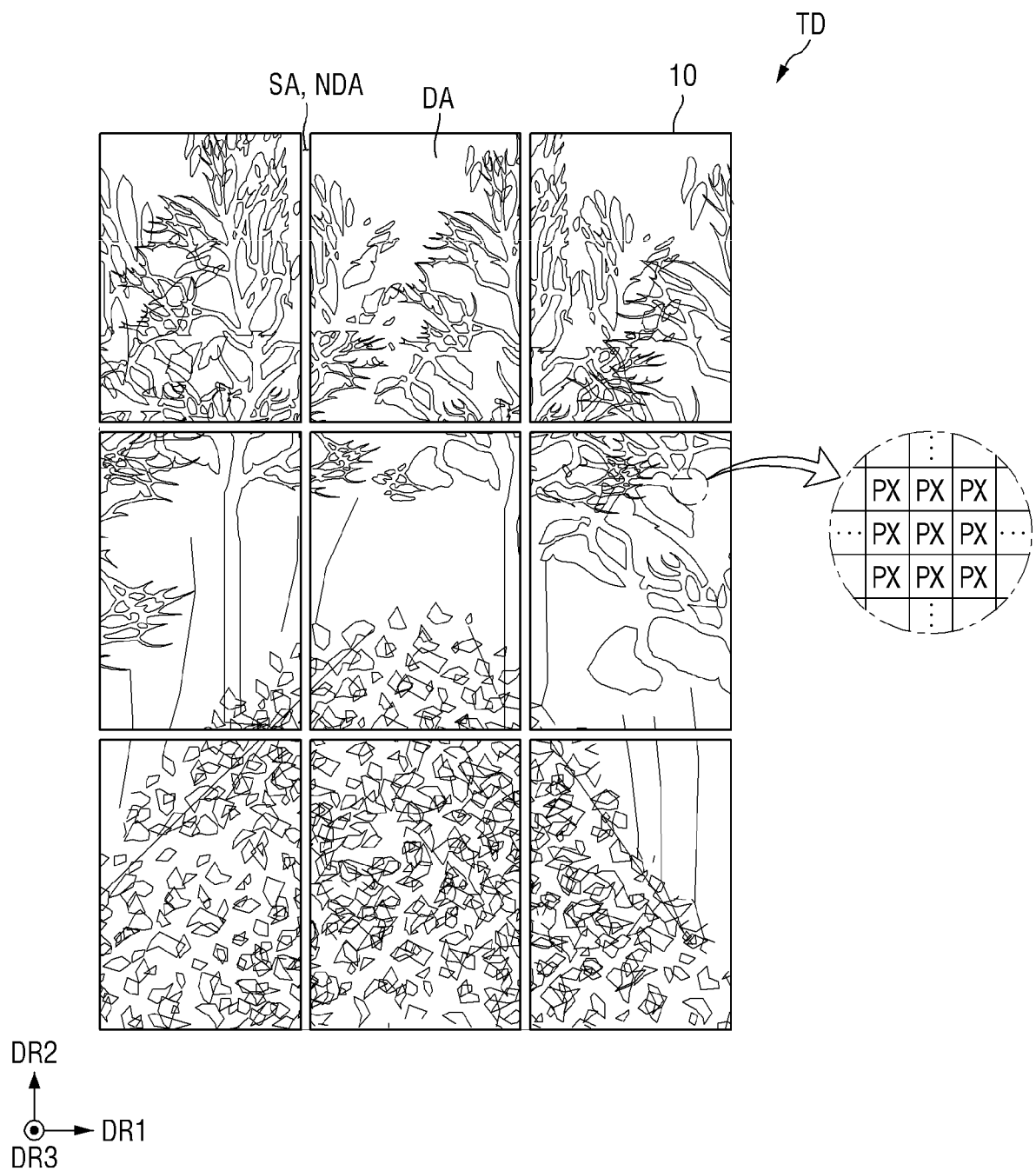
FIG. 1 is a plan view of a tiled display according to one or more embodiments of the present disclosure.
Figure 2:
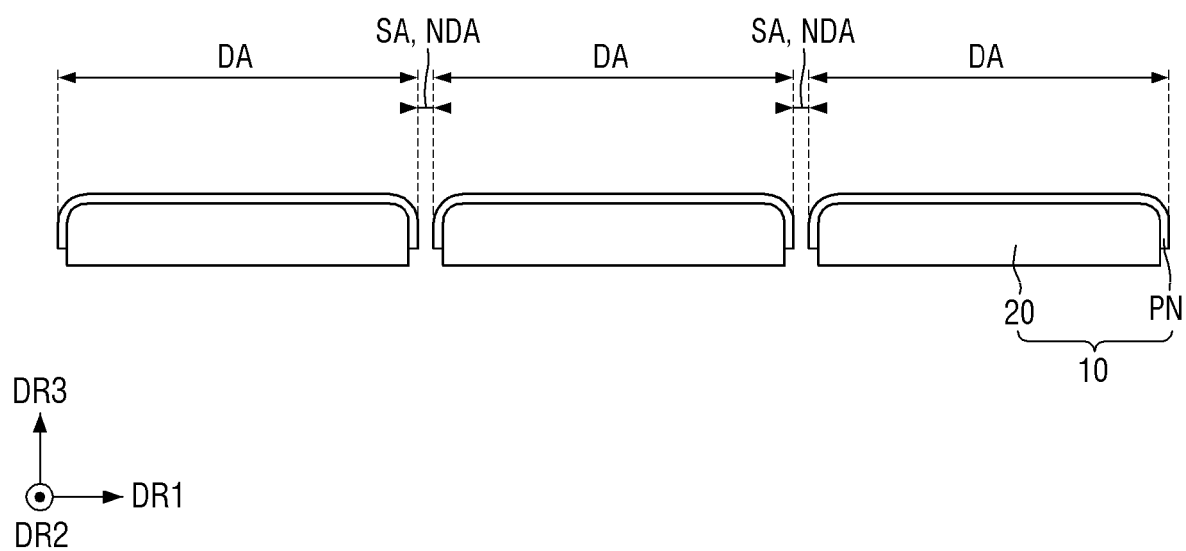
FIG. 2 is a cross-sectional view of a tiled display according to one or more embodiments of the present disclosure.

FIG. 1 is a plan view of a tiled display according to one or more embodiments of the present disclosure. FIG. 2 is a cross-sectional view of a tiled display according to one or more embodiments of the present disclosure.

Referring to FIGS. 1 and 2, a tiled display TD may display a moving image or a still image. The tiled display TD may refer to any electronic device that provides a display screen. For example, the tiled display TD may include a television set, a laptop computer, a monitor, an electronic billboard, the Internet of Things (IoT) devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

Hereinafter, a tiled display TD according to one or more embodiments of the present disclosure will be described with reference to the drawings, wherein a first direction DR1, a second direction DR2, and a third direction DR3 are defined. The first direction DR1 may be perpendicular to the second direction DR2 in a plane The third direction DR3 may be perpendicular to the plane where the first direction DR1 and the second direction DR2 are located. The third direction DR3 may be perpendicular to each of the first direction DR1 and the second direction DR2. In the following description of the tiled display TD, the third direction DR3 indicates the thickness direction (or the display side) of the display device 10.

According to one or more embodiments of the present disclosure, the tiled display TD may include a plurality of display devices 10.

The tiled display TD may have a rectangular shape including shorter sides in the first direction DR1 and longer sides in the second direction DR2 when viewed from the top. The tiled display TD may have, but is not limited to, a generally planar shape. The tiled display TD may have a three-dimensional shape, giving a viewer a three-dimensional experience. For example, when the tiled display TD has a three-dimensional shape, at least some of the display devices 10 may have a curved shape, which will be described later. For another example, the display devices 10 may have a flat shape and may be arranged with suitable angles (e.g., set or predetermined angles), so that the tiled display TD may have a three-dimensional shape. The tiled display TD includes a plurality of display devices 10 to achieve a large display area where images are displayed.

Each of the plurality of display devices 10 may include a display panel PN and a bottom plate 20. Each bottom plate 20 may provide and support an area in which the display panel PN is disposed. The shape of the bottom plate 20 may follow the shape of the display devices 10 when viewed from the top. According to one or more embodiments of the present disclosure where the display devices 10 has a rectangular shape having shorter sides in the first direction DR1 and longer sides in the second direction DR2 when viewed from the top, the bottom plate 20 may have a rectangular shape having shorter sides in the first direction DR1 and longer sides in the second direction DR2. Although not shown in the drawings, a variety of lines and cables for electrically connecting the display devices 10 may be disposed in the bottom plate 20.

The display panel PN may be disposed on the bottom plate 20. The display panel PN may be fixed on a surface of the bottom plate 20 by a fastening member such as an adhesive.

The plurality of display devices 10 may be arranged in a matrix. For example, the plurality of display devices 10 may be arranged along rows and columns of a matrix. The plurality of display devices 10 may be spaced from one another in the first direction DR1 and the second direction DR2 when viewed from the top, and may be arranged with a desired space (e.g., a set or predetermined space) therebetween. As the display devices 10 are spaced from each other (e.g., spaced from one another by a predetermined space), it is possible to prevent one of the display devices 10 from being damaged by another adjacent one even if the display devices 10 are expanded by heat generated therein. Although the display devices 10 are arranged in a 3×3 matrix in the example shown in the drawings, the number and arrangement of the display devices 10 are not limited thereto.

Although the directions in which the display devices 10 are arranged coincide with the first and second directions DR1 and DR2 in which the longer and shorter sides of the tiled display are extended in the drawings, the present disclosure is not limited thereto. The directions in which the display devices 10 are arranged may be inclined by desired angles (e.g., set or predetermined angles) with respect to the directions in which the longer side/shorter side of the tiled display TD are extended.

Each of the display devices 10 may have a rectangular shape including shorter sides in the first direction DR1 and longer sides in the second direction DR2 when viewed from the top. It should be understood that the present disclosure is not limited thereto. Each of the display devices 10 may have a rectangular shape including longer sides in the first direction DR1 and shorter sides in the second direction DR2. The plurality of display devices 10 may have the same shape when viewed from the top. In addition, the plurality of display devices 10 may have the same size. It should be understood that the present disclosure is not limited thereto. The plurality of display devices 10 may have different shapes or different sizes when viewed from the top.

The display devices 10 disposed adjacent to each other may be spaced so that their longer sides and/or the shorter sides face each other. Some of the plurality of display devices 10 included in the tiled display TD may be disposed at an edge of the tiled display TD and may be disposed adjacent to one side of the tiled display TD. Some other display devices 10 among the plurality of display devices 10 included in the tiled display TD may be disposed adjacent to the corners of the tiled display TD. Yet other display devices 10 among the plurality of display devices 10 included in the tiled display TD may be disposed on the inner side of the tiled display TD and may be surrounded by the other display devices 10.

Each of the plurality of display devices 10 includes a display panel PN providing a display screen. Examples of the display panel PN may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel PN, but the present disclosure is not limited thereto. Any other display panel may be employed as long as the technical idea of the present disclosure can be equally applied.

The display panel PN may include a display area DA. In the display area DA, images may be displayed. The shape of the display area DA may follow the shape of the display panel PN. For example, the shape of the display area DA may have a rectangular shape generally similar to the shape of the display panel PN when viewed from the top. The display area DA may generally occupy the center of the display panel PN.

The display area DA may include a plurality of pixels PX. The plurality of pixels PX may be arranged in a matrix. For example, the plurality of pixels PX may be arranged along rows and columns of a matrix. The shape of each of the pixels PX may be rectangular or square when viewed from the top. In one or more embodiments, each of the pixels PX may include a plurality of light-emitting elements made of inorganic particles. It should be understood that the present disclosure is not limited thereto.

The tiled display TD may include a non-display area NDA that is a boundary area SA (or seam area) between adjacent display devices 10. In the non-display area NDA, no image may be displayed.

The boundary area SA may be substantially identical to the non-display area NDA, and may be a seam area between the adjacent display devices 10. The boundary area SA may also be referred to as a seam. In one or more embodiments, the boundary area SA may be surrounded by the display areas DA of the display devices 10 disposed adjacent to each other. The boundary area SA may be the area between the display areas DA of adjacent display devices 10, and the adjacent display devices 10 are so close to each other that the boundary area may not be noticed by a viewer. The reflectance of external light at the display areas DA of the plurality of display devices 10 may be substantially equal to the reflectance of external light at the non-display areas NDA between the display devices 10. Accordingly, the tiled display TD can prevent the non-display areas NDA or the boundary areas SA between the plurality of display devices 10 from being noticed, allowing a viewer to get immersed into the images without noticing the seams between the display devices 10.

Figure 3:
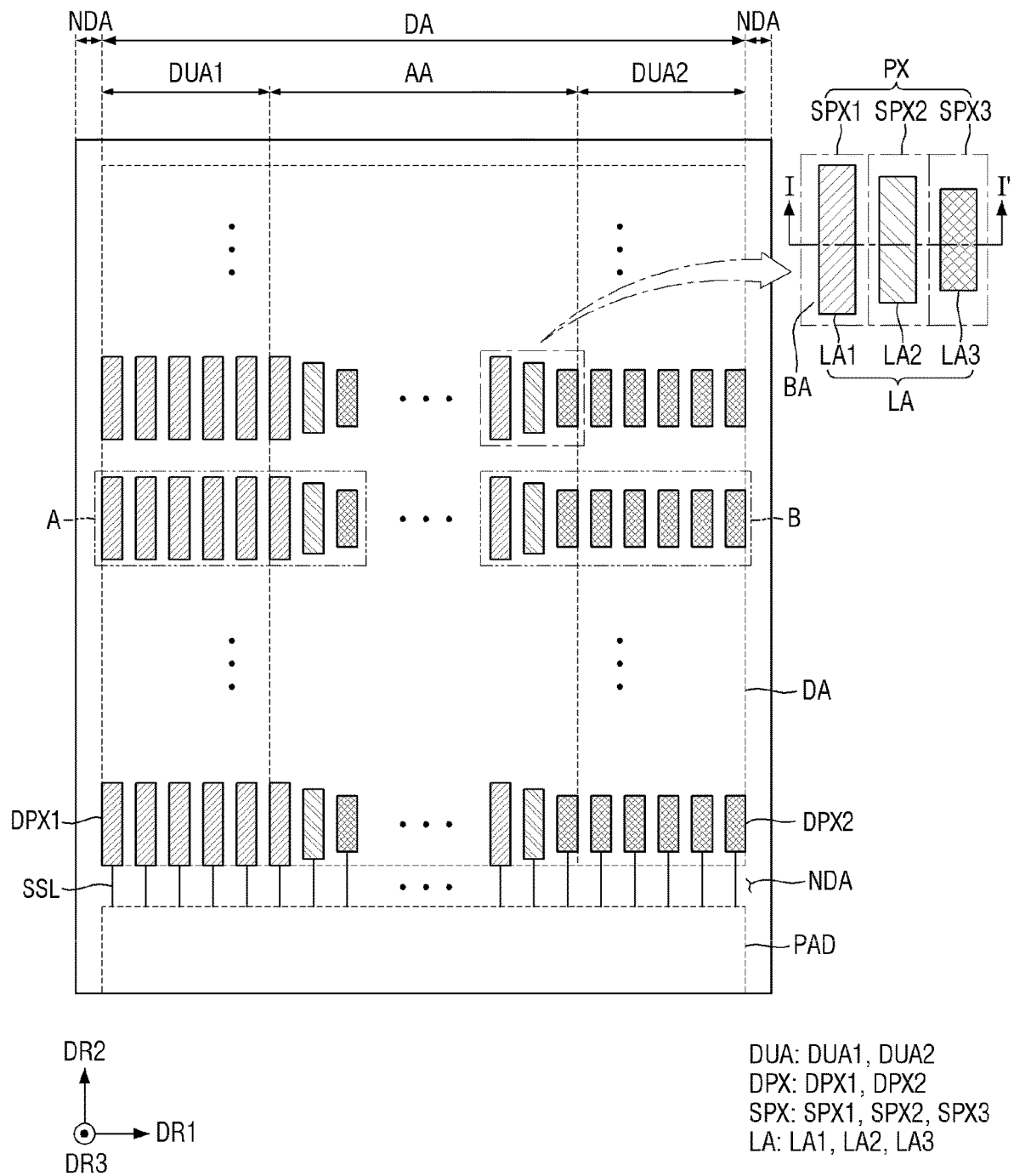
FIG. 3 is a plan view showing a display panel of a display device according to one or more embodiments of the present disclosure.

FIG. 3 is a plan view showing a display panel of a display device according to one or more embodiments of the present disclosure.

In FIG. 3, the display panel PN of one of the display devices 10 of the tiled display TD is shown as an example.

Referring to FIG. 3, the display panel PN may include the display area DA and the non-display area NDA. The display area DA may include an active area AA and dummy areas DUA disposed around the active area AA. The active area AA may occupy most of the display area DA, and a plurality of pixels PX may be disposed therein to display an image. A plurality of dummy pixels DPX may be disposed in the dummy areas DUA to compensate for luminance around the active area AA.

The active area AA of the display area DA includes a plurality of pixels PX arranged in rows and columns. Each of the pixels PX refers to a repeating minimum unit for displaying images. In order to display full color, each of the pixels PX may include a plurality of sub-pixels SPX: SPX1, SPX2, and SPX3, which emit different colors. The sub-pixels SPX may be sequentially and repeatedly arranged in the order of the first sub-pixel SPX1, the second sub-pixel SPX2 and the third sub-pixel SPX3 along the first direction DR1. According to one or more embodiments of the present disclosure, each of the pixels PX may include a first sub-pixel SPX1 responsible for emitting light of a first color, a second sub-pixel SPX2 responsible for emitting light of a second color, and a third sub-pixel SPX3 responsible for emitting light of a third color. For example, the first color may be red, the second color may be green, and the third color may be blue.

Each of the sub-pixels SPX may include a light exit area LA: LA1, LA2, and LA3 defined by a pixel-defining layer and a light-blocking area BA around it.

In the light exit areas LA, light emitted from the light-emitting element layer of the display panel PN is provided to the outside. In the light-blocking BA, light emitted from the light-emitting element layer does not transmit.

The light exit areas LA: LA1, LA2, and LA3 may include a first light exit area LA1, a second light exit area LA2, and a third light exit area LA3. The first to third light exit areas LA1, LA2, and LA3 may be the light exit areas LA of the first to third sub-pixels SPX1, SPX2, and SPX3, respectively. For example, the first light exit area LA1 may be the light exit area of the first sub-pixel SPX1, the second light exit area LA2 may be the light exit area of the second sub-pixel SPX2, and the third light exit area LA3 may be the light exit area of the third sub-pixel SPX3.

In the first to third light exit areas LA1, LA2, and LA3, light having desired wavelengths (e.g., set or predetermined wavelengths) may be output to the outside of the display panel PN. The first light exit area LA1 may output light of a first color, the second light exit area LA2 may output light of a second color, and the third light exit area LA3 may output light of a third color. For example, the light of the first color may be red light having a peak wavelength in the range of 610 to 650 nm, the light of the second color may be green light having a peak wavelength in the range of 510 to 550 nm, and the light of the third color may be blue light having a peak wavelength in the range of 440 to 480 nm. It is, however, to be understood that the present disclosure is not limited thereto.

The first to third light exit areas LA1, LA2, and LA3 may be sequentially and repeatedly arranged along the first direction DR1 in the active area AA of the display area DA. The shape of the first to third light exit areas LA1, LA2, and LA3 may be, but is not limited to, a rectangle having the width in the second direction DR2 larger than the width in the first direction DR1.

According to one or more embodiments of the present disclosure, the width of the first transmitting area LA1 in the first direction DR1, the width of the second transmitting area LA2 in the first direction DR1, and the width of the third transmitting area LA3 in the first direction DR1 may be substantially all equal. It is to be noted that the relationships among the widths of the first to third transmitting areas LA1, LA2, and LA3 in the first direction DR1 are not limited to the embodiment shown in FIG. 3. For example, the width of the first transmitting area LA1 in the first direction DR1, the width of the second transmitting area LA2 in the first direction DR1, and the width of the third transmitting area LA3 in the first direction DR1 may be different from one another.

In addition, the length of the first light existing area LA1 in the second direction DR2, the length of the second light exit area LA2 in the second direction DR2, and the length of the third light exit area LA3 in the second direction DR2 may be different from one another. For example, the length of the first light existing area LA1 in the second direction DR2 may be greater than the length of the second light exit area LA2 in the second direction DR2 and the length of the third light exit area LA3 in the second direction DR2. On the other hand, the length of the third light existing area LA3 in the second direction DR2 may be smaller than the length of the first light exit area LA1 in the second direction DR2 and the length of the second light exit area LA2 in the second direction DR2. It is to be noted that the relationships among the lengths of the first to third light exit areas LA1, LA2, and LA3 in the second direction DR2 are not limited to the embodiment shown in FIG. 3. For example, the length of the first light existing area LA1 in the second direction DR2, the length of the second light exit area LA2 in the second direction DR2, and the length of the third light exit area LA3 in the second direction DR2 may be all equal.

The light-blocking area BA may be disposed to be around (or surround) the light exit areas LA: LA1, LA2, and LA3. The light-blocking area BA of a sub-pixel SPX meets the light-blocking area BA of an adjacent sub-pixel SPX (regardless of whether the adjacent sub-pixel SPX is in the same pixel PX). The blocking areas BA of the adjacent sub-pixels SPX may be connected to each other as one, and further, the blocking areas BA of all sub-pixels SPX may be connected to one another as one. It is, however, to be understood that the present disclosure is not limited thereto. The light exit areas LA of the sub-pixels SPX may be distinguished by the blocking areas BA.

According to one or more embodiments of the present disclosure, the display panel PN may include a plurality of dummy pixels DPX: DPX1 and DPX2 disposed in the dummy areas DUA: DUA1 and DUA2 of the display area DA, respectively. The plurality of dummy pixels DPX can prevent the boundary areas SA (see FIG. 2) and the outermost areas of the tiled display TD from being noticed by a viewer by way of increasing the luminance at the boundary areas SA and the outermost areas. The dummy areas DUA in which the dummy pixels DPX are disposed may be disposed around the active area AA, for example, may be disposed on both sides of the active area AA in the first direction DR1. It should be understood, however, that the present disclosure is not limited thereto. The dummy area DUA may be disposed on both sides of the active area AA in the second direction DR2 or may be disposed on the both sides of the active area AA in the first direction DR1 as well as on the both sides in the second direction DR2.

For example, the dummy areas DUA may include a first dummy area DUA1 disposed on one side of the active area AA and a second dummy area DUA2 disposed on the opposite side of the active area AA. The first dummy area DUA1 may include a plurality of first dummy pixels DPX1, and the second dummy area DUA2 may include a plurality of second dummy pixels DPX2. The dummy areas DUA and the plurality of dummy pixels DPX will be described later with reference to other drawings.

The display panel PN may include a pad area PAD disposed in the non-display area NDA on one side of the display area DA. The pad area PAD may receive various driving signals from an external source and transmit them to signal lines of the display panel PN.

Signal lines SSL to which driving signals are applied from the pad area PAD may be connected to the plurality of pixels PX and the plurality of dummy pixels DPX disposed in the display area DA. Although one signal line SSL is depicted in the drawing, a plurality of signal lines SSL may be connected. For example, the plurality of signal lines SSL may include a data line, a driving voltage line, a reference voltage line, etc. Accordingly, the plurality of dummy pixels DPX as well as the plurality of pixels PX can be individually driven in response to driving signals applied through the signal lines SSL.

Figure 4:
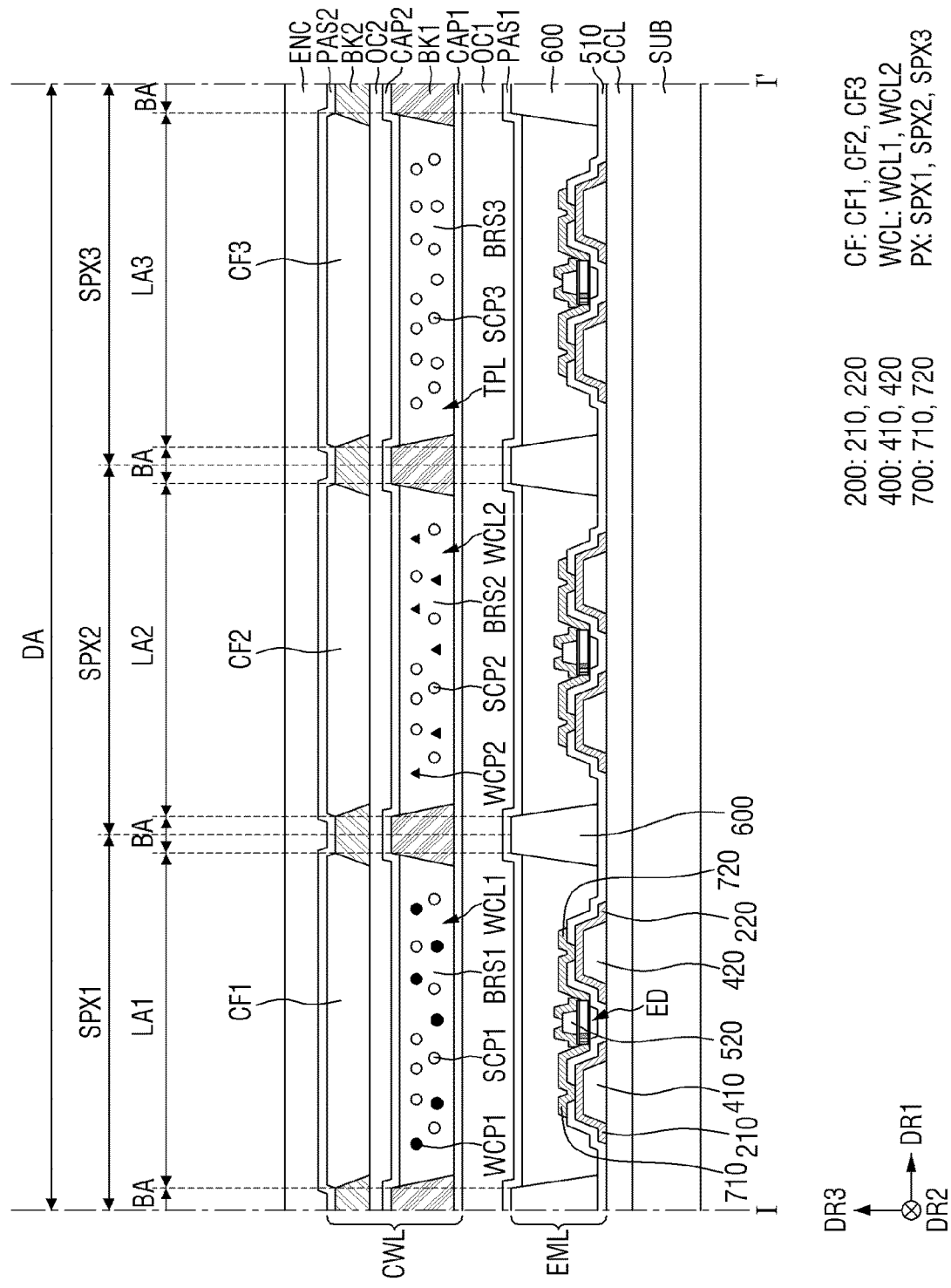
FIG. 4 is a cross-sectional view showing the display panel, taken along the line I-I' of FIG. 3.

FIG. 4 is a cross-sectional view showing the display panel, taken along the line I-I' of FIG. 3.

Referring to FIG. 4, the display panel PN may include a substrate SUB, a circuit layer CCL disposed on the substrate SUB, an emissive layer EML disposed on the circuit layer CCL, a color control layer CWL disposed on the emissive layer EML. The color control layer CWL may include wavelength control layers WCL and TPL, a color filter layer CF, a first light-blocking member BK1, and a second light-blocking member BK2.

The substrate SUB may be an insulating substrate. The substrate SUB may be made of an insulating material such as glass, quartz, and a polymer resin. The substrate SUB may be either a rigid substrate or a flexible substrate that can be bent, folded, or rolled.

The circuit layer CCL for driving the pixel PX (or the sub-pixels SPX) may be disposed on a surface of the substrate SUB. The circuit layer CCL may include at least one transistor or the like to drive the emissive layer EML.

The emissive layer EML may be disposed on a surface of the circuit layer CCL. The emissive layer EML may include a first bank 400, a second bank 600, a first electrode 210, a second electrode 220, a first connection electrode 710, a second connection electrode 720, a light-emitting diode ED, and a plurality of insulating layers 510 and 520.

The first bank 400 may be disposed on the circuit layer CCL. The first bank 400 may be disposed in each of the first to third light exit areas LA1, LA2, and LA3 of the first to third sub-pixels SPX1, SPX2, and SPX3. A plurality of first banks 400 may be disposed in the first to third light exit areas LA1, LA2, and LA3, and the first banks 400 may be spaced from one another in the first direction DR1. In one or more embodiments, the first bank 400 disposed in the light exit area LA of each sub-pixel SPX may include a first sub-bank 410 and a second sub-bank 420.

The first electrode 210 may be disposed on the first sub-bank 410 to cover the first sub-bank 410. The second electrode 220 may be disposed on the second sub-bank 420 to cover the second sub-bank 420. The first electrode 210 and the second electrode 220 may be electrically insulated from each other.

The first insulating layer 510 may be disposed on the first electrode 210 and the second electrode 220, and may expose at least portions of the first electrode 210 and the second electrode 220. The first insulating layer 510 may protect the first electrode 210 and the second electrode 220 and insulate them from each other. In addition, the first insulating layer 510 may also prevent that the light-emitting diodes ED disposed thereon are brought into contact with other elements and damaged.

The second bank 600 may be disposed on the first insulating layer 510 and may include an opening exposing the first bank 400 and the plurality of light-emitting diodes ED. The second bank 600 may be disposed at the boundary of sub-pixels SPX to distinguish adjacent sub-pixels SPX from each other. The second bank 600 may be disposed at the boundary between adjacent sub-pixels SPX. The second bank 600 can prevent an ink from overflowing into adjacent sub-pixels PX during an inkjet printing process using an ink in which a plurality of light-emitting diodes ED is dispersed.

The light-emitting diodes ED may be disposed on the first insulating layer 510 between the first sub-bank 410 and the second sub-bank 420. The light-emitting diodes ED may be disposed between the first electrode 210 and the second electrode and 220 so that their ends are disposed on the first insulating layer 510 between the first electrode 210 and the second electrode 220.

The plurality of light-emitting diodes ED may include an active layer so that they may emit light of the same wavelength range or light of the same color. The lights output from the first to third light exit areas LA1, LA2, and LA3, respectively, may have the same color. For example, the plurality of light-emitting diodes ED may emit light of the third color or blue light having a peak wavelength in the range of 440 nm to 480 nm. Therefore, the emission material layer EML may emit, but is not limited to, light of the third color or blue light.

The second insulating layer 520 may be partially disposed on the light-emitting diodes ED disposed between the first sub-bank 410 and the second sub-bank 420. The second insulating layer 520 may be disposed to partially be around (or surround) the outer surface of the light-emitting diodes ED. The second insulating layer 520 may be disposed on the light-emitting diodes ED to expose both ends of the light-emitting diodes ED. The second insulating layer 520 can protect the light-emitting element ED and fix the light-emitting diode ED during the process of fabricating the display panel PN.

The first connection electrode 710 may be disposed on the first electrode 210, and the second connection electrode 720 may be disposed on the second electrode 220. The first connection electrode 710 and the second connection electrode 720 may be electrically insulated from each other.

The first and second connection electrodes 710 and 720 may be in contact with the light-emitting diodes ED and the plurality of electrodes 210 and 220, respectively. For example, the first connection electrode 710 may be in contact with a portion of the first electrode 210 exposed by the first insulating layer 510 and with first ends of the light-emitting diodes ED exposed by the second insulating layer 520. The second connection electrode 720 may be in contact with a portion of the second electrode 220 exposed by the first insulating layer 510 and with second ends of the light-emitting diodes ED exposed by the second insulating layer 520.

The first ends of the light-emitting diodes ED exposed by the second insulating layer 520 may be electrically connected to the first electrode 210 through the first connection electrode 710, and the second ends thereof may be electrically connected to the second electrode 220 through the second connection electrode 720.

The display panel PN may further include a first protective layer PAS1 and a first planarization layer OC1.

The first protective layer PAS1 may be disposed on the emissive layer EML. The first protective layer PAS1 can protect the emissive layer EML. The first protective layer PAS1 can prevent permeation of impurities such as moisture and air from the outside to prevent damage to the plurality of light-emitting diodes ED.

The first planarization layer OC1 may be disposed on the first protective layer PAS1. The first planarization layer OC1 may be disposed on the emissive layer EML to provide a flat surface over the emissive layer EML. The first planarization layer OC1 may include an organic material. For example, the first planarization layer OC1 may be at least one of an acrylic resin, an epoxy resin, a phenol resin, a polyamide resin, and a polyimide resin.

The color control layer CWL may be disposed on the first planarization layer OC1. The color control layer CWL may include a first capping layer CAP1, wavelength control layers WCL and TPL, a first light-blocking member BK1, a second capping layer CAP2, a color filter layer CF, a second light-blocking member BK2, and a second protective layer PAS2.

The first capping layer CAP1 may be disposed on the first planarization layer OC1. The first capping layer CAP1 may encapsulate the lower surfaces of the wavelength control layers WCL and TPL. The first capping layer CAP1 may include an inorganic material. For example, the first capping layer CAP1 may include at least one of: silicon nitride, aluminum nitride, zirconium nitride, titanium nitride, hafnium nitride, tantalum nitride, silicon oxide, aluminum oxide, titanium oxide, tin oxide, cerium oxide and silicon oxynitride.

The first light-blocking member BK1 may be disposed on the first capping layer CAP1. The first light-blocking member BK1 may be disposed in the light-blocking area BA of the display area DA. The first light-blocking member BK1 may overlap the second bank 600 in the thickness direction of the display panel PN (e.g., in the third direction DR3). The first light-blocking member BK1 may block the transmission of light. The first light-blocking member BK1 can improve the color gamut by preventing lights from intruding and mixing among the first to third light exit areas LA1, LA2, and LA3. The first light-blocking member BK1 may be arranged in a lattice shape to be around (or surrounding) the first to third light exit areas LA1, LA2, and LA3 when viewed from the top. The light exit areas LA: LA1, LA2, and LA3 and the blocking areas BA may be defined by a first light-blocking member BK1 or the second light-blocking member BK2 to be described later.

The first light-blocking member BK1 may include an organic light-blocking material and a liquid repellent component. Herein, the liquid repellent component may be composed of a fluorine-containing monomer or a fluorine-containing polymer, and specifically, may include a fluorine-containing aliphatic polycarbonate. For example, the first light-blocking member BK1 may be made of a black organic material including the liquid repellent component. The first light-blocking member BK1 may be formed via coating and exposure processes for an organic light-blocking material containing a liquid repellent component, etc.

The wavelength control layers WCL and TPL may be disposed on the first capping layer CAP1 exposed by the first light-blocking member BK1. The wavelength control layers WCL and TPL may include wavelength conversion layers WCL that convert the wavelengths of light incident on the wavelength control layers WCL and TPL, and a transparent pattern TPL that transmits light incident on the wavelength control layer WCL and TPL without changing the wavelength of the light.

The wavelength conversion layer WCL or the transparent pattern TPL may be disposed separately in each of the sub-pixels SPX. The wavelength conversion layer WCL or the transparent pattern TPL may be disposed in the light exit area LA of the display area DA, and the wavelength conversion layer WCL and/or the transparent pattern TPL adjacent to each other may be spaced from each other by the first light-blocking member BK1 disposed in the blocking area BA.

The wavelength conversion layer WCL and the transparent pattern TPL may be disposed on the first capping layer CAP1. In one or more embodiments, the wavelength conversion layer WCL and the transparent pattern TPL may be formed by inkjet printing. It is, however, to be understood that the present disclosure is not limited thereto. The wavelength conversion layer WCL and the transparent pattern TPL may be formed by applying a photosensitive material, exposing it to light, and developing and patterning it. In the following description, it is assumed that the wavelength conversion layer WCL and the transparent pattern TPL are formed by inkjet printing.

The wavelength conversion layer WCL may be disposed in a sub-pixel SPX with a color different from the wavelength of light incident from the emissive layer EML so as to convert the wavelength. The transparent pattern TPL may be disposed in a sub-pixel SPX with the same color as the wavelength of the light incident from the emissive layer EML. According to one or more embodiments, the light of the third color is incident from the emissive layer EML disposed in each sub-pixel SPXn, and the wavelength conversion layer WCL is disposed in each of the first sub-pixel SPX1 and the second sub-pixel SPX2 while the transparent pattern TPL is disposed in the third sub-pixel SPX3.

According to one or more embodiments of the present disclosure, the wavelength conversion layer WCL may include a first wavelength conversion pattern WCL1 disposed in the first sub-pixel SPX1, and a second wavelength conversion pattern WCL2 disposed in the second sub-pixel SPX2.

The first wavelength conversion pattern WCL1 may be disposed in the first light exit area LA1 defined by the first light-blocking member BK1 in the first sub-pixel SPX1. The first wavelength conversion pattern WCL1 may convert light that has the wavelength of the third color and is incident from the emissive layer EML into light having the wavelength of the first color different from the third color and then output it. For example, the first wavelength conversion pattern WCL1 may convert blue light incident from the emissive layer EML into red light and then output it.

The first wavelength conversion pattern WCL1 may include a first base resin BRS1, and first wavelength-converting particles WCP1 dispersed in the first base resin BRS1. The first wavelength conversion pattern WCL1 may further include first scattering particles SCP1 dispersed in the first base resin BRS1.

The second wavelength conversion pattern WCL2 may be disposed in the second light exit area LA2 defined by the first light-blocking member BK1 in the second sub-pixel SPX2. The second wavelength conversion pattern WCL2 may convert light that has the wavelength of the third color and is incident from the emissive layer EML into light having the wavelength of the second color different from the third color and then output it. For example, the second wavelength conversion pattern WCL2 may convert blue light incident from the emissive layer EML into green light and then output it.

The second wavelength conversion pattern WCL2 may include a second base resin BRS2 and second wavelength-converting particles WCP2 dispersed in the second base resin BRS2. The second wavelength conversion pattern WCL2 may further include second scattering particles SCP2 dispersed in the second base resin BRS2.

The transparent pattern TPL may be disposed in the third light exit area LA3 defined by the first light-blocking member BK1 in the third sub-pixel SPX3. The transparent pattern TPL may output the light incident from the emissive layer EML without changing its wavelength. For example, the transparent pattern TPL transmits blue light incident from the emissive layer EML without changing its wavelength.

The transparent pattern TPL may include a third base resin BRS3. The transparent pattern TPL may further include third scattering particles SCP3 dispersed in the third base resin BRS3.

The first to third base resins BRS1, BRS2, and BRS3 may include a transparent organic material. For example, the first to third base resins BRS1, BRS2, and BRS3 may include an epoxy resin, an acrylic resin, a cardo resin, an imide resin, or the like. The first to third base resins BRS1, BRS2, and BRS3 may be made of, but is not limited to, the same material.

The first to third scattering particles SCP1, SCP2, and SCP3 may have refractive indexes different from those of the first to third base resins BRS1, BRS2, and BRS3. The first to third scattering particles SCP1, SCP2, and SCP3 may include metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. Examples of the material of the organic particles may include an acrylic resin, a urethane resin, etc. The first to third scattering particles SCP1, SCP2, and SCP3 may be made of, but is not limited to, the same material.

The first wavelength-converting particles WCP1 may convert the third color into the first color, and the second wavelength-converting particles WCP2 may convert the third color into the second color. For example, the first wavelength-converting particles WCP1 may be a material that converts blue light into red light, and the second wavelength-converting particles WCP2 may be a material that converts blue light into green light. The first wavelength-converting particles WCP1 and the second wavelength-converting particles WCP2 may be quantum dots, quantum rods, phosphors, etc. The quantum dots may include Group IV nanocrystals, Group II-VI compound nanocrystals, Group III-V compound nanocrystals, Group IV-VI nanocrystals, or combinations thereof.

The second capping layer CAP2 may be disposed on the wavelength control layers WCL and TPL and the first light-blocking member BK1. For example, the second capping layer CAP2 may encapsulate the first wavelength conversion pattern WCL1, the second wavelength conversion pattern WCL2, the transparent pattern TPL, and a first light-blocking member BK1, to prevent damage or contamination to the first wavelength conversion pattern WCL1, the second wavelength conversion pattern WCL2, and the transparent pattern TPL. The second capping layer CAP2 may be made of an inorganic material. The second capping layer CAP2 may be made of the same material as the first capping layer CAP1, or may be made of the above-listed materials of the first capping layer CAP1.

The second planarization layer OC2 may be disposed on the second capping layer CAP2 to provide a flat surface over the first and second wavelength conversion patterns WLC1 and WLC2 and the transparent pattern TPL. The second planarization layer OC2 may include an organic material. For example, the second planarization layer OC2 may be at least one of an acrylic resin, an epoxy resin, a phenol resin, a polyamide resin, and a polyimide resin.

The second light-blocking member BK2 may be disposed on the second planarization layer OC2. The second light-blocking member BK2 may be disposed in the light-blocking area BA of the display area DA along the boundary of the sub-pixel SPX on the second planarization layer OC2. The second light-blocking member BK2 may overlap the first light-blocking member BK1 and/or the second bank 600 in the thickness direction of the display panel PN (e.g., in the third direction DR3).

The second light-blocking member BK2 may be partially disposed in the non-display area NDA as well. The second light-blocking member BK2 may cover side surfaces of the first light-blocking member BK1 and the second planarization layer OC2 in the non-display area NDA.

The second light-blocking member BK2 may not only block leakage of light but also suppress reflection of external light. The second light-blocking member BK2 may be arranged in a lattice shape around (or surrounding) the first to third light exit areas LA1, LA2, and LA3 when viewed from the top.

The second light-blocking member BK2 may include an organic material. According to one or more embodiments of the present disclosure, the second light-blocking member BK2 may include a light-absorbing material that absorbs light in the visible wavelength range. The second light-blocking member BK2 may include a light-absorbing material and may be disposed along the boundaries of the sub-pixels SPX. Accordingly, the second light-blocking member BK2 may define the light exit areas LA: LA1, LA2, and LA3 of the sub-pixels SPX. In other words, the second light-blocking member BK2 may be a subsidiary pixel-defining layer defining the light exit area LA and the light-blocking area BA of each of the sub-pixels SPX.

The color filter layer CF may be disposed on the second planarization layer OC2 in the display area DA. The color filter layer CF may be disposed on one surface of the second planarization layer OC2 in an area defined by the second light-blocking member BK2.

The color filter layer CF may include a first color filter CF1, a second color filter CF2, and a third color filter CF3.

The first color filter CF1 may be disposed in the first light exit area LA1 of the first sub-pixel SPX1, the second color filter CF2 may be disposed in the second light exit area LA2 of the second sub-pixel SPX2, and the third color filter CF3 may be disposed in the third light exit area LA3 of the third sub-pixel SPX3. The first to third color filters CF1, CF2, and CF3 may be surrounded by the second light-blocking member BK2.

The first to third color filters CF1, CF2, and CF3 may include a colorant such as a dye and a pigment that absorbs wavelengths other than a given color wavelength. The first color filter CF1 may selectively transmit light of the first color (e.g., red light) and may block and absorb light of the second color (e.g., green light) and light of the third color (e.g., blue light). The second color filter CF2 may selectively transmit light of the second color (e.g., green light) and may block and absorb light of the first color (e.g., red light) and light of the third color (e.g., blue light). The third color filter CF3 may selectively transmit light of the third color (e.g., blue light) and may block and absorb light of the first color (e.g., red light) and light of the second color (e.g., green light). For example, the first color filter CF1 may be a red color filter, the second color filter CF2 may be a green color filter, and the third color filter CF3 may be a blue color filter.

The first to third color filters CF1, CF2, and CF3 may absorb a portion of the light introduced from the outside of the display panel PN to reduce reflection of external light. Accordingly, the first to third color filters CF1, CF2, and CF3 can prevent or reduce color distortion due to reflection of external light.

The color filter layer CF is disposed on the first and second wavelength conversion patterns WCL1 and WCL2 and the transparent pattern TPL through the second planarization layer OC2, and thus the display panel PN requires no additional substrate for the color filter layer CF. Therefore, the thickness of the display panel PN may be relatively reduced.

The second protective layer PAS2 may be disposed on the color filter layer CF and the second light-blocking member BK2 to cover them. The second protective layer PAS2 may protect the color filter layer CF.

The first encapsulation layer ENC may be disposed on the color control layer CWL. The first encapsulation layer ENC may be disposed on the second protective layer PAS2. For example, the first encapsulation layer ENC may include at least one inorganic film to prevent permeation of oxygen or moisture. In addition, the first encapsulation layer ENC may include at least one organic film to protect other elements disposed under the first encapsulation layer ENC from particles such as dust.

Figure 5:
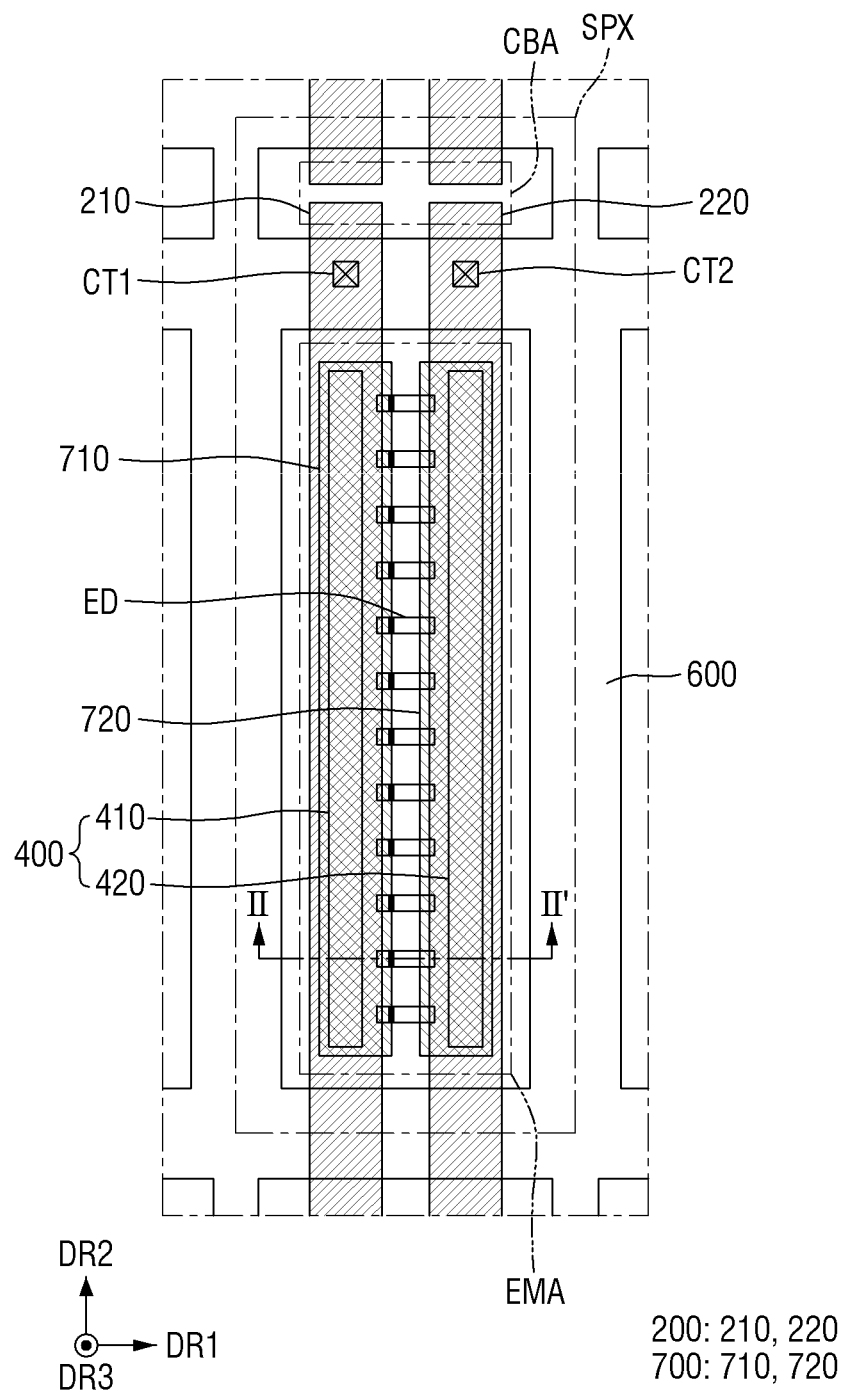
FIG. 5 is a plan view showing a sub-pixel of an emissive layer according to one or more embodiments of the present disclosure.
Figure 6:
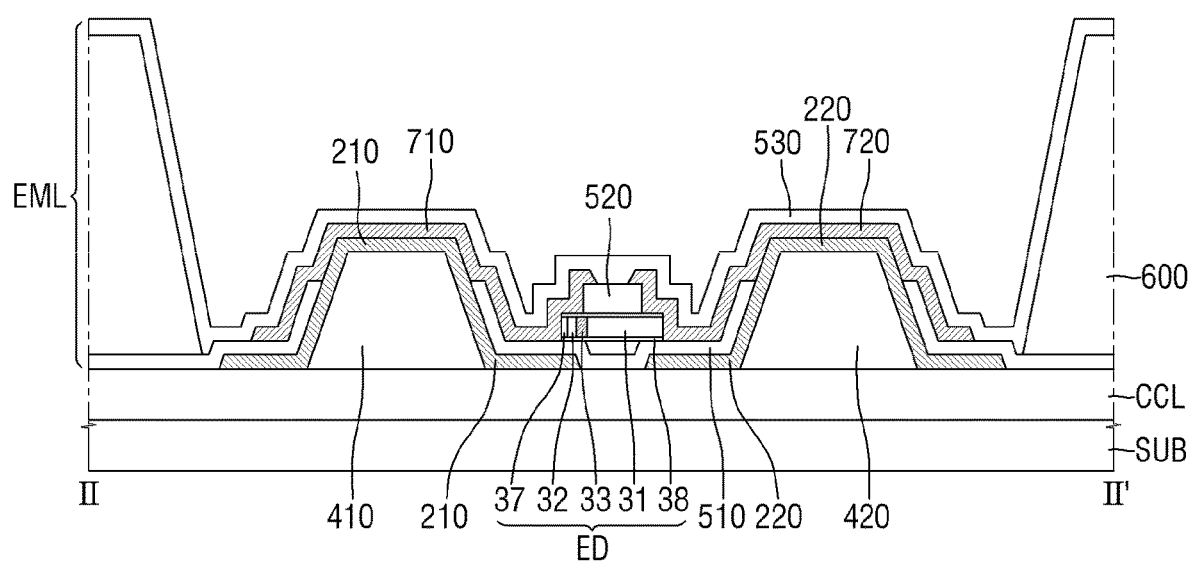
FIG. 6 is a cross-sectional view taken along the line II-II' of FIG. 5.

FIG. 5 is a plan view showing a sub-pixel of an emissive layer according to one or more embodiments of the present disclosure. FIG. 6 is a cross-sectional view taken along the line II-II' of FIG. 5;

Referring to FIG. 6, each sub-pixel SPX of the emissive layer EML of the display panel PN may include an emission area EMA and a non-emission area. In the emission area EMA, light emitted from the light-emitting diodes ED may exit. In the non-emission area, light emitted from the light-emitting diodes ED do not reach and thus no light exits therefrom.

The emission area EMA may include an area where the light-emitting diodes ED are disposed, and an area adjacent to it. In addition, the emission area EMA may further include an area in which light emitted from the light-emitting diodes ED is reflected or refracted by other elements to exit.

Each sub-pixel SPX may further include a cut area CBA disposed in the non-emission area. The cut area CBA may be disposed on one side of the emission area EMA in the second direction DR2. The cut area CBA may be disposed between the emission areas EMA of neighboring sub-pixels SPX in the second direction DR2.

At the cut area CBA, electrode layers 210 and 220 of a sub-pixel SPX are separated from those of another sub-pixel SPX adjacent to it in the second direction DR2. The electrodes 210 and 220 disposed in each of the sub-pixels SPX may be disposed separately from each other at the cut area CBA. A portion of each of the electrode layers 210 and 220 disposed in each of the sub-pixels SPX may be disposed at the cut area CBA.

Referring to FIGS. 5 and 6, the first bank 400 may be extended in the second direction DR2 in each sub-pixel SPX when viewed from the top. As described above, the first bank 400 may include first and second sub-banks 410 and 420 spaced from each other, and a plurality of light-emitting diodes ED may be disposed in the space between the first and second sub-banks 410 and 420.

At least a portion of each of the first and second sub-banks 410 and 420 may protrude from the upper surface of the substrate SUB. The protruding portion of each of the first and second sub-banks 410 and 420 may have the inclined side surfaces. Accordingly, it is possible to direct toward the upper side (e.g., display side) the light, which is emitted from the light-emitting diodes ED and travels toward the side surfaces of the first and second sub-banks 410 and 420.

The first and second electrodes 210 and 220 may be disposed on the first and second sub-banks 410 and 420, respectively. The first and second electrodes 210 and 220 may be spaced from each other.

Each of the first electrode 210 and the second electrode 220 may have a shape extended in the second direction DR2 when viewed from the top. The first electrode 210 and the second electrode 220 may be spaced from each other in the first direction DR1.

The first electrode 210 may be extended in the second direction DR2 so that it overlaps with a portion of the second bank 600 extended in the first direction DR1. The first electrode 210 may be electrically connected to the circuit layer CCL through a first contact hole CT1.

The second electrode 220 may be extended in the second direction DR2 so that it overlaps with a portion of the second bank 600 extended in the first direction DR1. The second electrode 220 may be electrically connected to the circuit layer CCL through a second contact hole CT2.

Each of the first and second electrodes 210 and 220 may be electrically connected to the light-emitting diodes ED, and a suitable voltage (e.g., a set or predetermined voltage) may be applied so that the light-emitting diodes ED emit light. For example, the first and second electrodes 210 and 220 may be electrically connected to the light-emitting diodes ED disposed between the first electrode 210 and the second electrode 220 through the connection electrodes 710 and 720, and may transmit electric signals applied to the electrodes 210 and 220 to the light-emitting diodes ED through the connection electrodes 710 and 720.

The first insulating layer 510 may be disposed on the first electrode 210 and the second electrode 220, and may expose at least portions of the first electrode 210 and the second electrode 220.

The second bank 600 may be disposed on the first insulating layer 510. The second bank 600 may be disposed in a lattice pattern, including portions extended in the first direction DR1 and the second direction DR2 when viewed from the top. The second bank 600 may have a height greater than a height of the first bank 400. It should be understood, however, that the present disclosure is not limited thereto.

The light-emitting diodes ED may be disposed on the first insulating layer 510 between the first sub-bank 410 and the second sub-bank 420 so that their ends are disposed on the electrodes 210 and 220, respectively. The light-emitting diodes ED may have a shape extended in one direction. The direction in which the electrodes 210 and 220 are extended may be substantially perpendicular to the direction in which the light-emitting diodes ED are extended.

The second insulating layer 520 may be partially disposed on the light-emitting diodes ED disposed between the first electrode 210 and the second electrode 220. The second insulating layer 520 may be disposed on the light-emitting diodes ED to expose both ends of the light-emitting diodes ED.

The first and second connection electrodes 710 and 720 may be disposed on the second insulating layer 520. The first and second connection electrodes 710 and 720 may have a shape extended in a direction when viewed from the top. Each of the first connection electrode 710 and the second connection electrode 720 may have a shape extended in the second direction DR2. The first connection electrode 710 and the second connection electrode 720 may be spaced from each other and face each other in the first direction DR1 on the second insulating layer 520.

The first ends of the light-emitting diodes ED exposed by the second insulating layer 520 may be electrically connected to the first electrode 210 through the first connection electrode 710, and the second ends thereof may be electrically connected to the second electrode 220 through the second connection electrode 720.

The third insulating layer 530 may be disposed entirely on the substrate SUB. The third insulating layer 530 can protect a plurality of light-emitting diodes ED disposed on the substrate SUB, the first and second electrodes 210 and 220, the first and second connection electrodes 710 and 720, and a plurality of insulating layers 510, 520, and 530 against the external environment.

Figure 7:
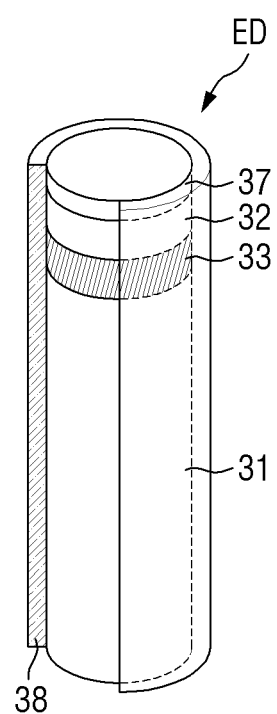
FIG. 7 is a schematic perspective cutaway view of a light-emitting element according to one or more embodiments of the present disclosure.

FIG. 7 is a schematic perspective cutaway view of a light-emitting element according to one or more embodiments of the present disclosure.

Referring to FIG. 7, the light-emitting diode ED is a particle-type element, and may have a rod-like or cylindrical shape having a suitable aspect ratio (e.g., a set or predetermined aspect ratio). The length of the light-emitting diode ED may be larger than the diameter of the light-emitting diode ED, and the aspect ratio may range from, but is not limited to, 1.2:1 to 100:1.

The light-emitting diodes ED may have a size of a nanometer scale (from 1 nm to 1 μm) to a micrometer scale (from 1 μm to 1 mm). According to one or more embodiments of the present disclosure, both of the diameter and length of the light-emitting element ED may be in nanometer scales or micrometer scales. In one or more embodiments, the diameter of the light-emitting element ED may be in a nanometer scale, while the length of the light-emitting element ED may be in a micrometer scale. In one or more embodiments, the diameter and/or length of some of the light-emitting elements ED may be in nanometer scales, while the diameter and/or length of some others of the light-emitting diodes ED may be in micrometer scales.

The light-emitting element ED may be an inorganic light-emitting diode. The inorganic light-emitting diode may include a plurality of semiconductor layers. For example, the inorganic light-emitting diode may include a first conductivity type (e.g., n-type) semiconductor layer, a second conductivity type (e.g., p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and electrons reaching the active semiconductor layer may be combined to emit light.

According to one or more embodiments of the present disclosure, the above-described semiconductor layers may be sequentially stacked along the longitudinal direction of the light-emitting element ED. The light-emitting diode ED may include a first semiconductor layer 31, an active layer 33, and a second semiconductor layer 32 sequentially stacked in the longitudinal direction, as shown in FIG. 7. The first semiconductor layer 31, the active layer 33, and the second semiconductor layer 32 may be a first conductivity type semiconductor layer, an active semiconductor layer, and a second conductivity type semiconductor layer described above, respectively.

The first semiconductor layer 31 may be doped with a first conductivity type dopant. The first conductivity type dopant may be Si, Ge, Sn, etc. According to one or more embodiments of the present disclosure, the first semiconductor layer 31 may be n-GaN doped with n-type Si.

The second semiconductor layer 32 may be spaced from the first semiconductor layers 31 with the active layer 33 therebetween. The second semiconductor layer 32 may be doped with a second conductivity-type dopant such as Mg, Zn, Ca, and Ba. According to one or more embodiments of the present disclosure, the second semiconductor layer 32 may be p-GaN doped with p-type Mg.

The active layer 33 may include a material having a single or multiple quantum well structure. As described above, the active layer 33 may emit light as electron-hole pairs are combined therein in response to an electrical signal applied through the first semiconductor layer 31 and the second semiconductor layer 32.

In one or more embodiments, the active layer 33 may have a structure in which a semiconductor material having a large band gap energy and a semiconductor material having a small band gap energy are alternately stacked on one another, and may include other Group III to Group V semiconductor materials depending on the wavelength range of the emitted light.

The light emitted from the active layer 33 may exit not only through the outer surfaces of the light-emitting diode ED in the longitudinal direction but also through both side surfaces. That is to say, the directions in which the light emitted from the active layer 33 propagates are not limited to one direction.

The light-emitting diode ED may further include an electrode layer 37 disposed on the second semiconductor layer 32. The electrode layer 37 may be in contact with the second semiconductor layer 32. The electrode layer 37 may be, but is not limited to, an ohmic contact electrode. It may be a schottky contact electrode.

When the both ends of the light-emitting diode ED are electrically connected to the connection electrodes 710 and 720 to apply electric signals to the first and second semiconductor layers 31 and 32, the electrode layer 37 may be disposed between the second semiconductor layer 32 and the connection electrodes 710 and 720 to reduce the resistance. The electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The electrode layer 37 may include a semiconductor material doped with n-type or p-type impurities.

The light-emitting diode ED may further include an insulating film 38 around (or surrounding) the outer surfaces (e.g., outer peripheral or circumferential surfaces) of the first semiconductor layer 31, the second semiconductor layer 32, the active layer 33, and/or the electrode layer 37. The insulating film 38 may be disposed to be around (or surround) at least the outer surface (e.g., the outer peripheral or circumferential surface) of the active layer 33, and may be extended in the direction in which the light-emitting diode ED is extended. The insulating film 38 can protect the above-described elements. The insulating film 38 may be made of materials having insulating properties and can prevent an electrical short-circuit that may occur when the active layer 33 comes in contact with an electrode through which an electric signal is transmitted to the light-emitting diode ED. In addition, because the insulating film 38 includes the active layer 33 to protect the outer surfaces (e.g., the outer peripheral or circumferential surfaces) of the first and second semiconductor layers 31 and 32, it is possible to prevent or reduce a decrease in luminous efficiency.

Referring to FIGS. 6 and 7, the first semiconductor layer 31, the active layer 33, the second semiconductor layer 32, and the electrode layer 37 of the light-emitting diode ED disposed on the substrate SUB may be stacked on one another in a direction parallel to the surface of the substrate SUB in the cross section traversing the both ends of the light-emitting diode ED. The insulating film 38 of the light-emitting diode ED may be disposed to be around (or surround) the side surfaces of the first semiconductor layer 31, the active layer 33, the second semiconductor layer 32, and the electrode layer 37, and thus the outer surface (e.g., the outer peripheral or circumferential surface) of the light-emitting diode ED disposed between the first electrode 210 and the second electrode 220 may be the insulating film 38.

Figure 8:
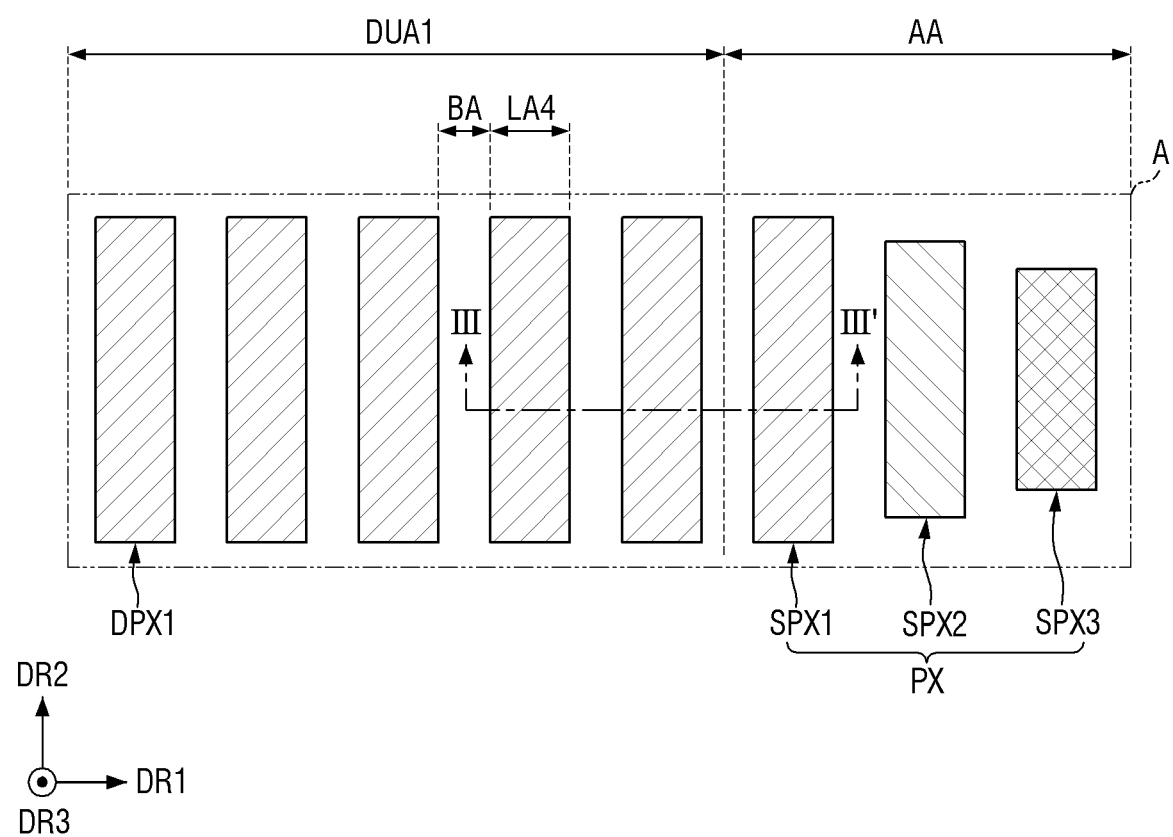
FIG. 8 is an enlarged plan view showing an area A of FIG. 3.
Figure 9:
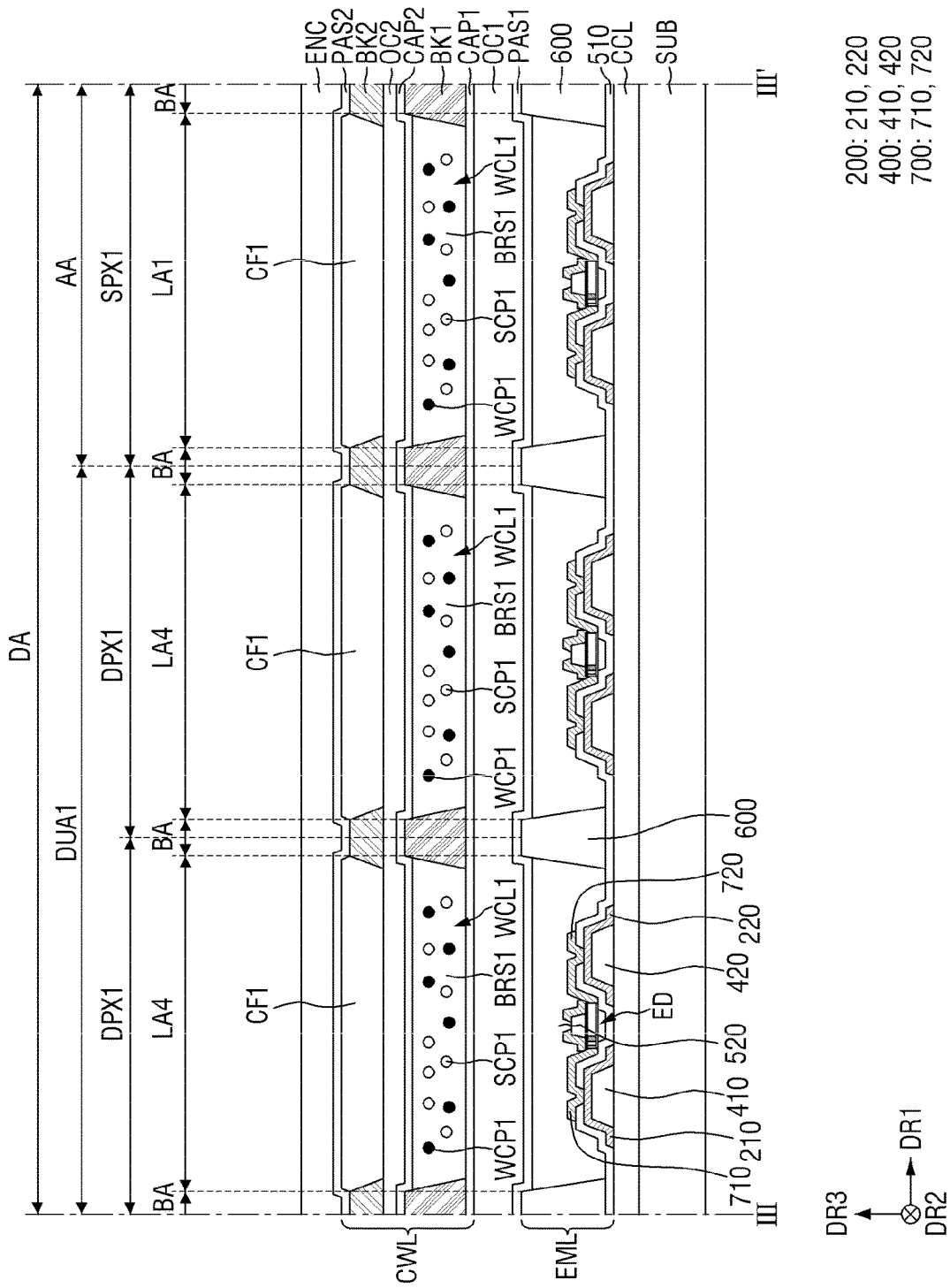
FIG. 9 is a cross-sectional view taken along the line III-III' of FIG. 8.
Figure 10:
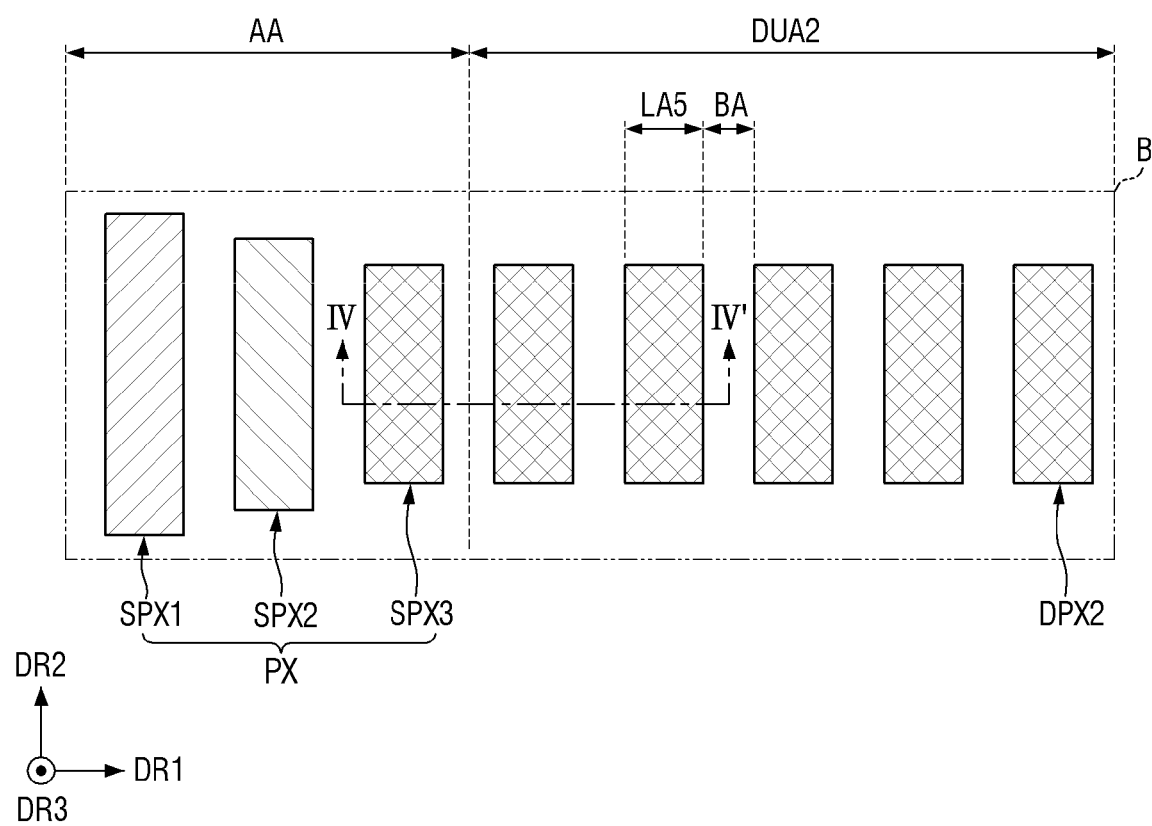
FIG. 10 is an enlarged plan view showing an area B of FIG. 3.
Figure 11:
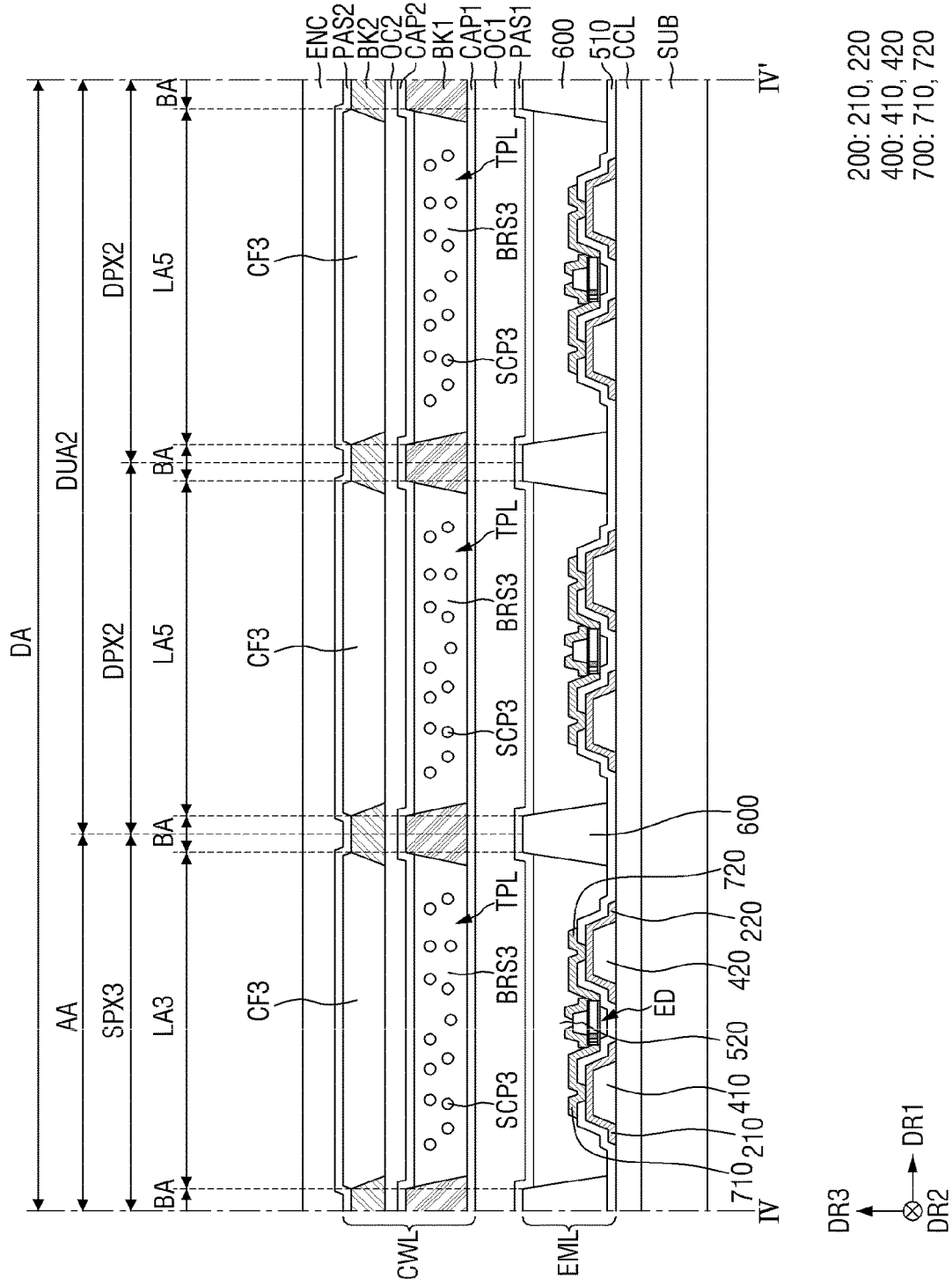
FIG. 11 is a cross-sectional view taken along the line IV-IV' of FIG. 10.

FIG. 8 is an enlarged plan view showing an area A of FIG. 3. FIG. 9 is a cross-sectional view taken along the line III-III' of FIG. 8. FIG. 10 is an enlarged plan view showing an area B of FIG. 3. FIG. 11 is a cross-sectional view taken along the line IV-IV' of FIG. 10.

Referring to FIGS. 8 and 9 in conjunction with FIG. 3, the display panel PN according to one or more embodiments may include the active area AA and the dummy areas DUA: DUA1 and DUA2 included in the display area DA. The dummy areas DUA may include the first dummy area DUA1 disposed on one side of the active area AA and the second dummy area DUA2 disposed on the opposite side of the active area AA.

The first dummy area DUA1 may include a plurality of first dummy pixels DPX1 arranged in rows and columns. The first dummy pixels DPX1 may emit light of the same color. The first dummy pixels DPX1 may be arranged sequentially from the active area AA such that they are spaced from each other along the horizontal direction. The first dummy pixels DPX1 may be responsible for emitting light of the first color.

Each of the first dummy pixels DPX1 may include a fourth light exit area LA4 and a light-blocking area BA. The fourth light exit area LA4 may be the light exit area of each of the first dummy pixels DPX1. In the fourth light exit area LA4, light (e.g., light having a predetermined wavelength) may exit to the outside of the display panel PN. The fourth light exit area LA4 may emit light of the first color.

The fourth light exit area LA4 may be arranged sequentially and repeatedly along the first direction DR1 in the first dummy area DUA1 of the display area DA. The fourth light exit area LA4 may have, but is not limited to, the same shape as the first light exit area LA1 of the adjacent first sub-pixel SPX1 when viewed from the top.

The light-blocking area BA may be disposed to be around (or surround) the light exit areas LA. The light-blocking area BA may be disposed to be around (or surround) a plurality of fourth light exit areas LA4 in the first dummy area DUA1. The light-blocking area BA may be entirely disposed in the active area AA and the first dummy area DUA1 of the display area DA.

The first dummy pixels DPX1 may be arranged such that they are spaced from each other (e.g., spaced from each other by a predetermined distance). The distance between the first dummy pixels DPX1 may be equal to the distance between the first sub-pixel SPX1 and a first dummy pixel DPX1 adjacent to it, but the present disclosure is not limited thereto. In addition, the first dummy pixels DPX1 may have the same shape and the same size as the adjacent first sub-pixel SPX1.

When an image is displayed in the active area AA of the display area DA, the plurality of first dummy pixels DPX1 may emit light at the outside of the display area DA to increase the luminance. The plurality of first dummy pixels DPX1 emits light of the same color to improve luminance, but may not contribute to composing an image in the active area AA. A more detailed description thereon will be given below.

As shown in FIG. 9, the plurality of first dummy pixels DPX1 may have the same cross-section and planar structure as the first sub-pixel SPX1.

For example, each of the first dummy pixels DPX1 may include the circuit layer CCL, the emissive layer EML, and the color control layer CWL on the substrate SUB in the first dummy area DUA1.

The color control layer CWL of the plurality of first dummy pixels DPX1 may have the same configuration as the color control layer CWL of the first sub-pixels SPX1. For example, each of the first dummy pixels DPX1 may include a first base resin BRS1, and a first wavelength conversion pattern WCL1 containing first wavelength-converting particles WCP1 and first scattering particles SCP1 dispersed in the first base resin BRS1. It should be noted that the first base resin BRS1, the first wavelength-converting particles WCP1, and the first scattering particles SCP1 may be identical to the first base resin BRS1, the first wavelength-converting particles WCP1 and the first scattering particles SCP1 of the first sub-pixel SPX1, respectively. In addition, each of the first dummy pixels DPX1 may include a first color filter CF1 identical to the first color filter CF1 of the first sub-pixel SPX1. Accordingly, the plurality of first dummy pixels DPX1 may emit light of the first color, like the first sub-pixels SPX1.

Referring to FIGS. 10 and 11 in conjunction with FIG. 3, the display panel PN according to one or more embodiments may include the second dummy area DUA2 located on the side (e.g., the opposite side) of the active area AA in the first direction DR1.

The second dummy area DUA2 may include a plurality of second dummy pixels DPX2 arranged in rows and columns. The second dummy pixels DPX2 may emit light of the same color. The second dummy pixels DPX2 may be arranged sequentially from the active area AA such that they are spaced from each other in the horizontal direction. The second dummy pixels DPX2 may be responsible for emitting light of the third color.

Each of the second dummy pixels DPX2 may include a fifth light exit area LA5 and a light-blocking area BA. The fifth light exit area LA5 may be the light exit area of each of the second dummy pixels DPX2. In the fifth light exit area LA5, light (e.g., light having a predetermined wavelength) may exit to the outside of the display panel PN. The fifth light exit area LA5 may emit light of the third color.

The fifth light exit area LA5 may be arranged sequentially and repeatedly along the first direction DR1 in the second dummy area DUA2 of the display area DA. The fifth light exit area LA5 may have, but is not limited to, the same shape as the third light exit area LA3 of the adjacent third sub-pixel SPX3 when viewed from the top.

The light-blocking area BA may be disposed to be around (or surround) the light exit areas LA. The light-blocking area BA may be disposed to be around (or surround) a plurality of fifth light exit areas LA5 in the second dummy area DUA2. The light-blocking area BA may be entirely disposed in the active area AA and the second dummy area DUA2 of the display area DA.

The second dummy pixels DPX2 may be arranged such that they are spaced from each other (e.g., spaced from each other by a predetermined distance). The distance between the second dummy pixels DPX1 may be equal to the distance between a third sub-pixel SPX3 and a second dummy pixel DPX2 adjacent to the third sub-pixel SPX3, but the present disclosure is not limited thereto. The second dummy pixels DPX2 may have the same shape and the same size as the adjacent third sub-pixels SPX3.

When an image is displayed in the active area AA of the display area DA, the plurality of second dummy pixels DPX2 may emit light at the outside of the display area DA to increase the luminance at the outside of the display area. The plurality of second dummy pixels DPX2 emits light of the same color to improve luminance, but may not contribute to composing an image in the active area AA. A more detailed description thereon will be given below.

As shown in FIG. 11, the plurality of second dummy pixels DPX2 may have the same cross-section and planar structure as the third sub-pixels SPX3.

For example, each of the second dummy pixels DPX2 may include a circuit layer CCL, an emissive layer EML, and a color control layer CWL on the substrate SUB in the second dummy area DUA2.

The color control layer CWL of the plurality of second dummy pixels DPX2 may have the same configuration as the color control layer CWL of the third sub-pixels SPX3. For example, each of the second dummy pixels DPX2 may include the transparent pattern TPL containing the third base resin BRS3, and the third scattering particles SCP3 dispersed in the third base resin BRS3. It should be noted that the third base resin BRS3 and the third scattering particles SCP3 may be identical to the third base resin BRS3 and the third scattering particles SCP3 of the third sub-pixel SPX3, respectively. In addition, each of the second dummy pixels DPX2 may include the third color filter CF3 identical to the third color filter CF3 of the third sub-pixel SPX3. Accordingly, the plurality of second dummy pixels DPX2 may emit light of the third color, like the third sub-pixels SPX3.

The above-described display devices 10 may be coupled to the tiled display TD.

Figure 12:
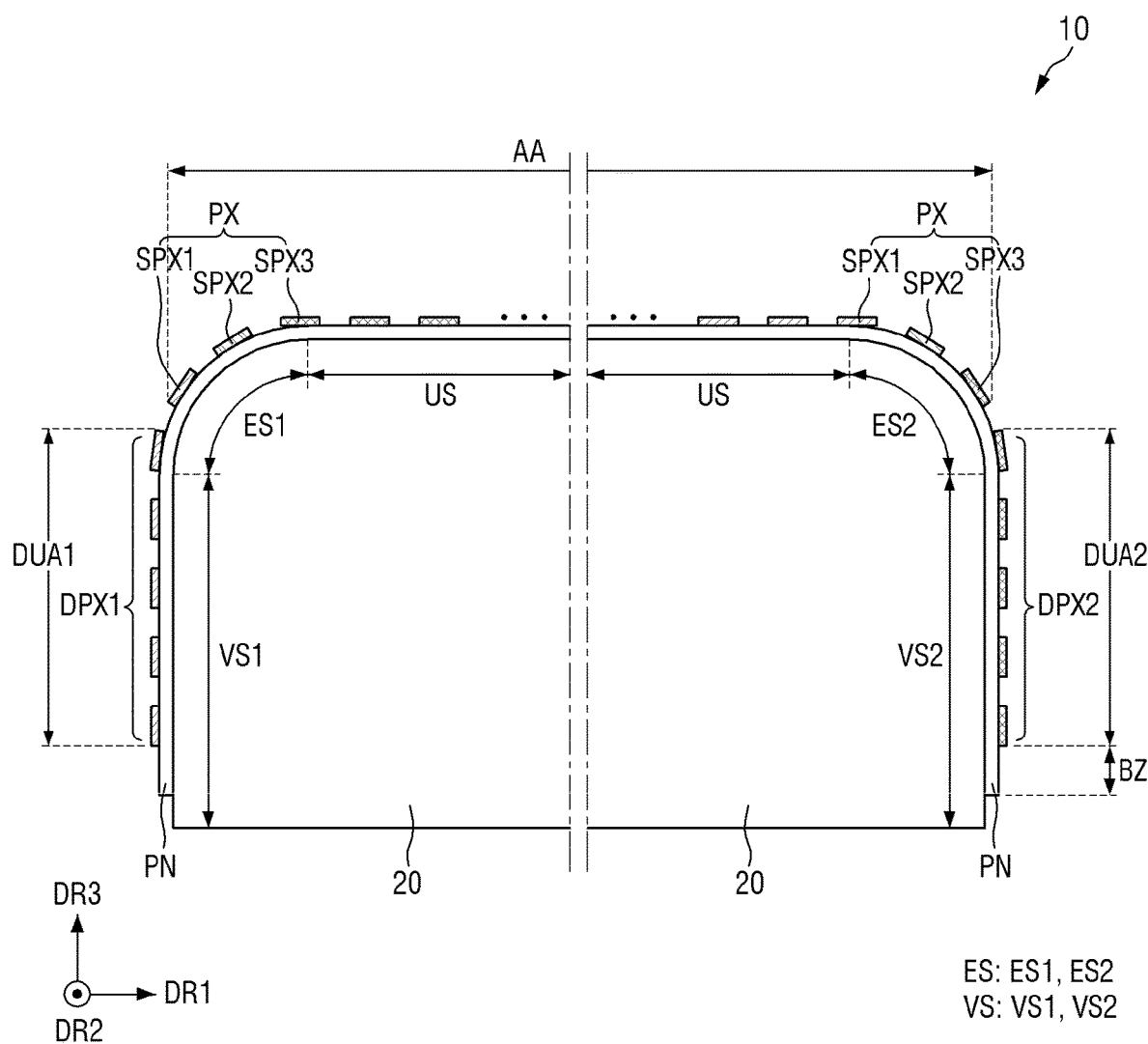
FIG. 12 is a cross-sectional view showing a display device of a tiled display according to one or more embodiments of the present disclosure.
Figure 13:
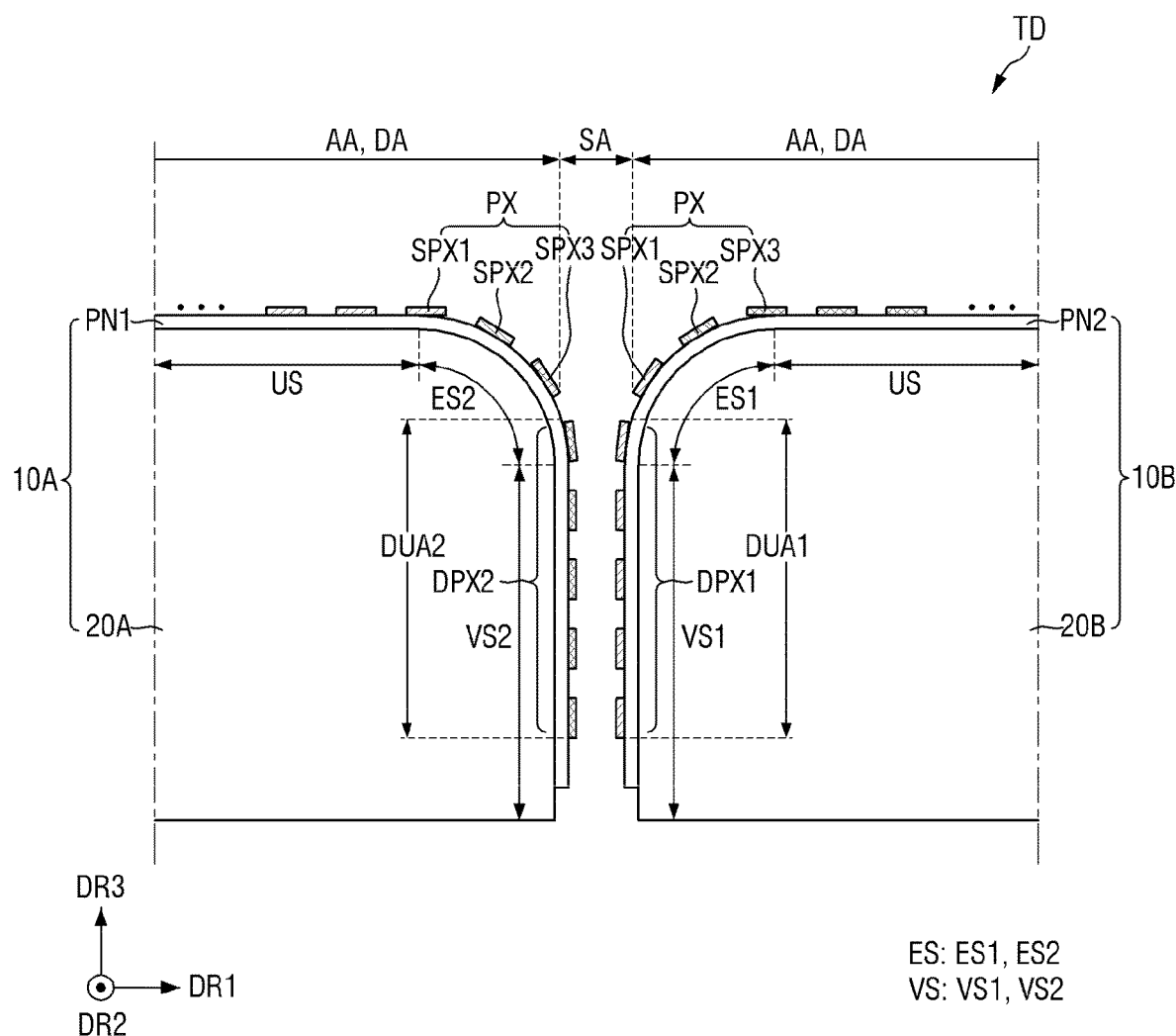
FIG. 13 is a cross-sectional view showing a boundary area of a tiled display according to one or more embodiments of the present disclosure.

FIG. 12 is a cross-sectional view showing a display device of a tiled display according to one or more embodiments of the present disclosure. FIG. 13 is a cross-sectional view showing a boundary area of a tiled display according to one or more embodiments.

Referring to FIG. 12, a display device 10 according to one or more embodiments may include a display panel PN and a bottom plate 20 coupled with the display panel PN. The bottom plate 20 may have a substantially quadrangular plate shape and may follow the shape of the display panel PN. The bottom plate 20 may include an upper surface US, side surfaces VS, and edge surfaces ES extended from the upper surface US to the side surfaces VS. The upper surface US may be a flat surface on which the active area AA of the display panel PN is located. The side surfaces VS may be extended in the third direction DR3 to vertically cross the upper surface US. The side surfaces VS may include a first side surface VS1 disposed on one side of the active area AA, and a second side surface VS2 facing (e.g., opposing) the first side surface VS1. For example, the first side surface VS1 may be the left side surface of the display device 10, and the second side surface VS2 may be the right side surface of the display device 10. The edge surfaces ES may connect the upper surface US with the side surfaces VS, and may have a round shape or a curved surface. The edge surfaces ES can facilitate coupling or bonding between the bottom plate 20 and the display panel PN. It should be understood, however, that the present disclosure is not limited thereto. The edge surfaces ES of the bottom plate 20 may be formed at a right angle. The plurality of edge surfaces ES may include a first edge surface ES1 disposed between the first side surface VS1 and the upper surface US, and a second edge surface ES2 disposed between the second side surface VS2 and the upper surface US.

The display panel PN may be disposed on the upper surface US, the plurality of edge surfaces ES, and the plurality of side surfaces VS of the bottom plate 20. An adhesive member may be disposed between the display panel PN and the bottom plate 20 to couple the display panel PN with the bottom plate 20. The display panel PN may be entirely coupled with and in contact with on the upper surface US, the plurality of edge surfaces ES, and the plurality of side surfaces VS of the bottom plate 20. As the display panel PN is coupled with the bottom plate 20, the rigidity of the display device 10 may be enhanced.

The active area AA of the display panel PN may be disposed on the upper surface US and the edge surfaces ES of the bottom plate 20. The active area AA refers to the area in which an image is actually displayed, and may be recognized by a user when the display panel PN is viewed from above. A plurality of pixels PX may be disposed in the active area AA to display an image. At least some of the sub-pixels SPX among the pixels PX disposed on the outermost position of the active area AA may be disposed on the first edge surface ES1 and the second edge surface ES2 of the bottom plate 20.

The first dummy area DUA1 of the display panel PN may be located on the first side surface VS1 and the first edge surface ES1 of the bottom plate 20. The first dummy area DUA1 is for improving the luminance at the border of the display panel PN, and may include a plurality of first dummy pixels DPX1. At least some of the plurality of first dummy pixels DPX1 may be disposed on the first edge surface ES1 of the bottom plate 20, while some others may be disposed on the first side surface VS1 of the bottom plate 20. It should be understood, however, that the present disclosure is not limited thereto. All of the first dummy pixels DPX1 may be disposed on the first side surface VS1 of the bottom plate 20.

The second dummy area DUA2 of the display panel PN may be located on the second side surface VS2 and the second edge surface ES2 of the bottom plate 20. The second dummy area DUA2 is for improving the luminance at the border of the display panel PN, and may include a plurality of second dummy pixels DPX2. At least some of the plurality of second dummy pixels DPX2 may be disposed on the second edge surface ES2 of the bottom plate 20, while some others may be disposed on the second side surface VS2 of the bottom plate 20. It should be understood, however, that the present disclosure is not limited thereto. All of the first dummy pixels DPX1 may be disposed on the second side surface VS2 of the bottom plate 20.

The number of the first dummy pixels DPX1 disposed on the first side surface VS1 among the first dummy pixels DPX1 in the first dummy area DUA1 may be equal to the number of the second dummy pixels DPX2 disposed on the second side surface VS2 among the second dummy pixels DPX2 in the second dummy area DUA2 disposed in the same first direction DR1.

The side surfaces of the display panel PN of the display device 10 are oriented toward the lower side (e.g., in the direction opposite to the third direction DR3), so that it is possible to prevent lights output from the pixels PX and the dummy pixels DPX1 and DPX2 from leaking through the side surfaces of the substrate.

Referring to FIG. 13, the tiled display TD according to one or more embodiments may include a plurality of display devices 10 having the above-described configuration. As shown in FIG. 2, the plurality of display devices 10 may be disposed adjacent to one another to form a large screen of the tiled display TD.

The plurality of display devices 10 may include a first display device 10A and a second display device 10B disposed adjacent to the first display device 10A. The first display device 10A may include a first display panel PN1 and a first bottom plate 20A, and the second display device 10B may include a second display panel PN2 and a second bottom plate 20B.

A boundary area SA may be located between the first display device 10A and the second display device 10B that are spaced from each other. In the boundary area SA, no pixels may be disposed in the third direction DR3 overlapping the boundary area SA. In the boundary area SA, neither the first display device 10A nor the second display device 10B may be disposed.

The first display device 10A and the second display device 10B may face each other at the boundary area SA. For example, the first to third sub-pixels SPX1, SPX2, and SPX3 of the first display panel PN1 disposed on the second edge surface ES2 of the first bottom plate 20A may face the second display panel PN2. The first to third sub-pixels SPX1, SPX2, and SPX3 of the second display panel PN2 disposed on the first edge surface ES1 of the second bottom plate 20B may face the first display panel PN1. The first to third sub-pixels SPX1, SPX2, and SPX3 of the first display panel PN1 may be disposed in the display area DA and the active area AA to display an image, and the first to third sub-pixels SPX1, SPX2 and SPX3 of the second display panel PN2 may be disposed in the display area DA and the active area AA to display an image.

In addition, the plurality of second dummy pixels DPX2 of the first display panel PN1 disposed on the second side surface VS2 of the first bottom plate 20A may face the second display panel PN2. For example, the plurality of second dummy pixels DPX2 of the first display panel PN1 may be disposed to face the first side surface VS1 of the second display panel PN2. The plurality of first dummy pixels DPX1 of the second display panel PN2 disposed on the first side surface VS1 of the second bottom plate 20B may be disposed to face the first display panel PN1. For example, the plurality of first dummy pixels DPX1 of the second display panel PN2 may be disposed to face the second side surface VS2 of the first display panel PN1. Accordingly, the plurality of second dummy pixels DPX2 of the first display panel PN1 may be disposed to face the plurality of first dummy pixels DPX1 of the second display panel PN2.

In one or more embodiments, the plurality of second dummy pixels DPX2 of the first display panel PN1 may be in line with the plurality of first dummy pixels DPX1 of the second display panel PN2 in the first direction DR1, respectively. It should be understood, however, that the present disclosure is not limited thereto. The plurality of second dummy pixels DPX2 of the first display panel PN1 may be moved by a suitable distance (e.g., a set or predetermined distance) in the third direction DR3, or the plurality of first dummy pixels DPX1 of the second display panel PN2 may be moved by a suitable distance (e.g., a set or predetermined distance) in the third direction DR3.

As described above, when a single image is displayed on the full screen, the boundary areas SA of the tiled display TD may be seen as seams of the image, hindering a viewer from getting immersed into the image. According to this embodiment, the dummy areas DUA1 and DUA2 including a plurality of dummy pixels DPX1 and DPX2, are formed at the borders of the display panels PN2 and PN1, respectively, and a plurality of dummy pixels DPX1 and DPX2 may be disposed on the edge surfaces ES1 and ES2 and/or the side surfaces VS1 and VS2 of the bottom plates 20B and 20A, respectively. In this manner, the plurality of dummy pixels DPX1 and DPX2 emit light to increase the luminance at the boundary area SA, so that the boundary area SA can be less noticeable, which otherwise is noticed due to the difference in luminance with the display area DA. In addition, by disposing the display panels PN1 and PN2 of the display devices adjacent to each other at the boundary area SA, the width of the boundary area SA may be reduced, and thus it can be less noticeable.

For example, when light is emitted from the plurality of dummy pixels DPX1 and DPX2 at the boundary area SA, the luminance of the boundary area SA may be even higher than that of the display area DA. According to one or more embodiments, as described above with reference to FIG. 3, the plurality of dummy pixels DPX1 and DPX2 may be driven individually. Accordingly, a difference in luminance between the dummy areas DUA1 and DUA2 and the active area AA is measured during a test driving of the display panels PN1 and PN2, and then luminance correction may be carried out to adjust the driving voltage to balance the luminance. The luminance correction may be carried out primarily after fabricating the individual display panels PN1 and PN2, and then secondarily after fabricating the tiled display TD. After performing the luminance correction twice, the luminance may be balanced between the boundary area SA and the display area DA, and thus the boundary area SA is less noticeable in displaying a single image. As a result, the display quality of the tiled display TD can be improved.

Hereinafter, one or more embodiments of the present disclosure will be described. In the following description, the same or similar elements will be denoted by the same or similar reference numerals, and redundant descriptions will be omitted or briefly described. Descriptions will focus on differences from the above embodiment.

Figure 14:
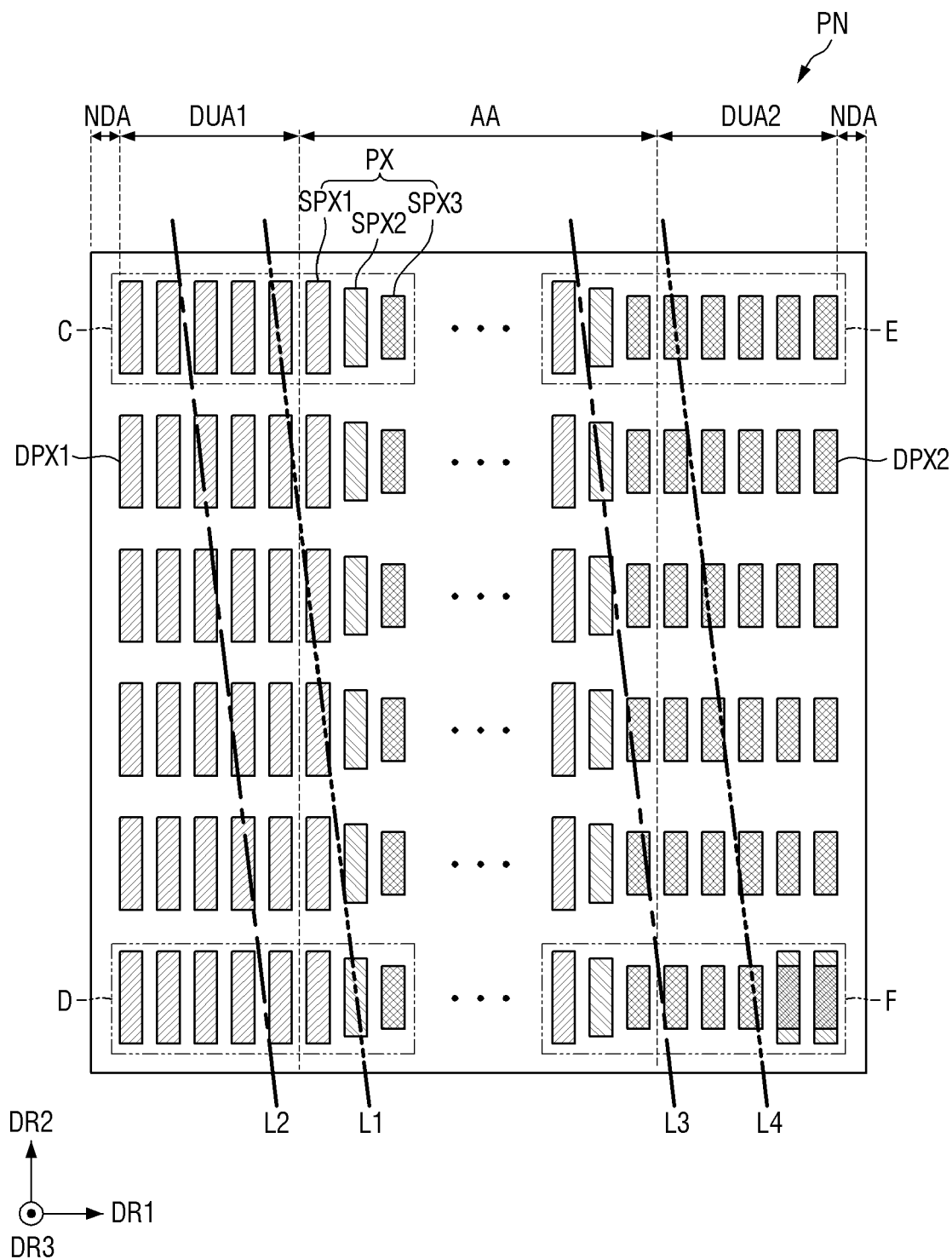
FIG. 14 is a plan view showing a display panel according to one or more embodiments of the present disclosure.
Figure 15:
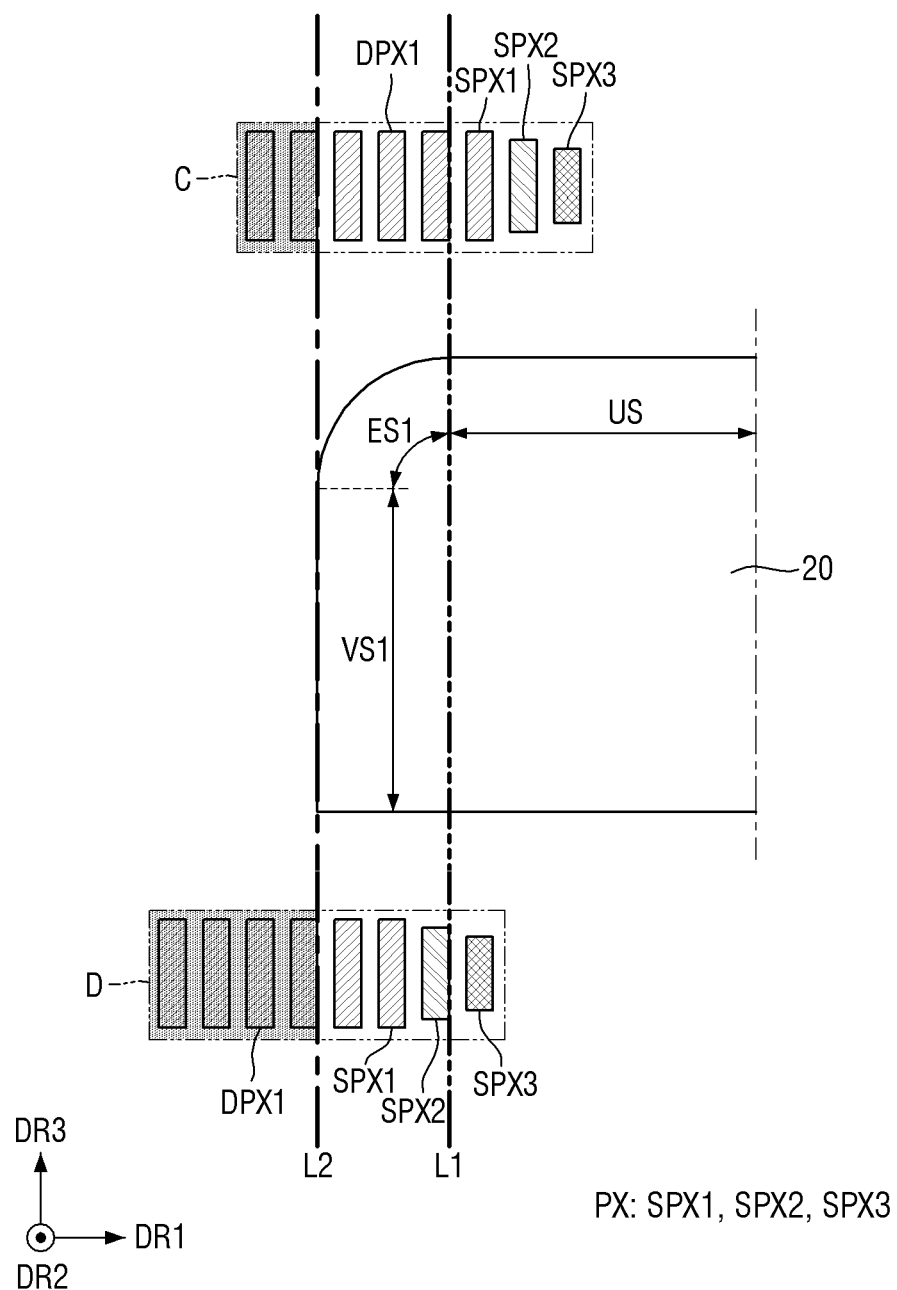
FIG. 15 is a view schematically showing the relationship between areas C and D of FIG. 14 and the bottom plate.
Figure 16:
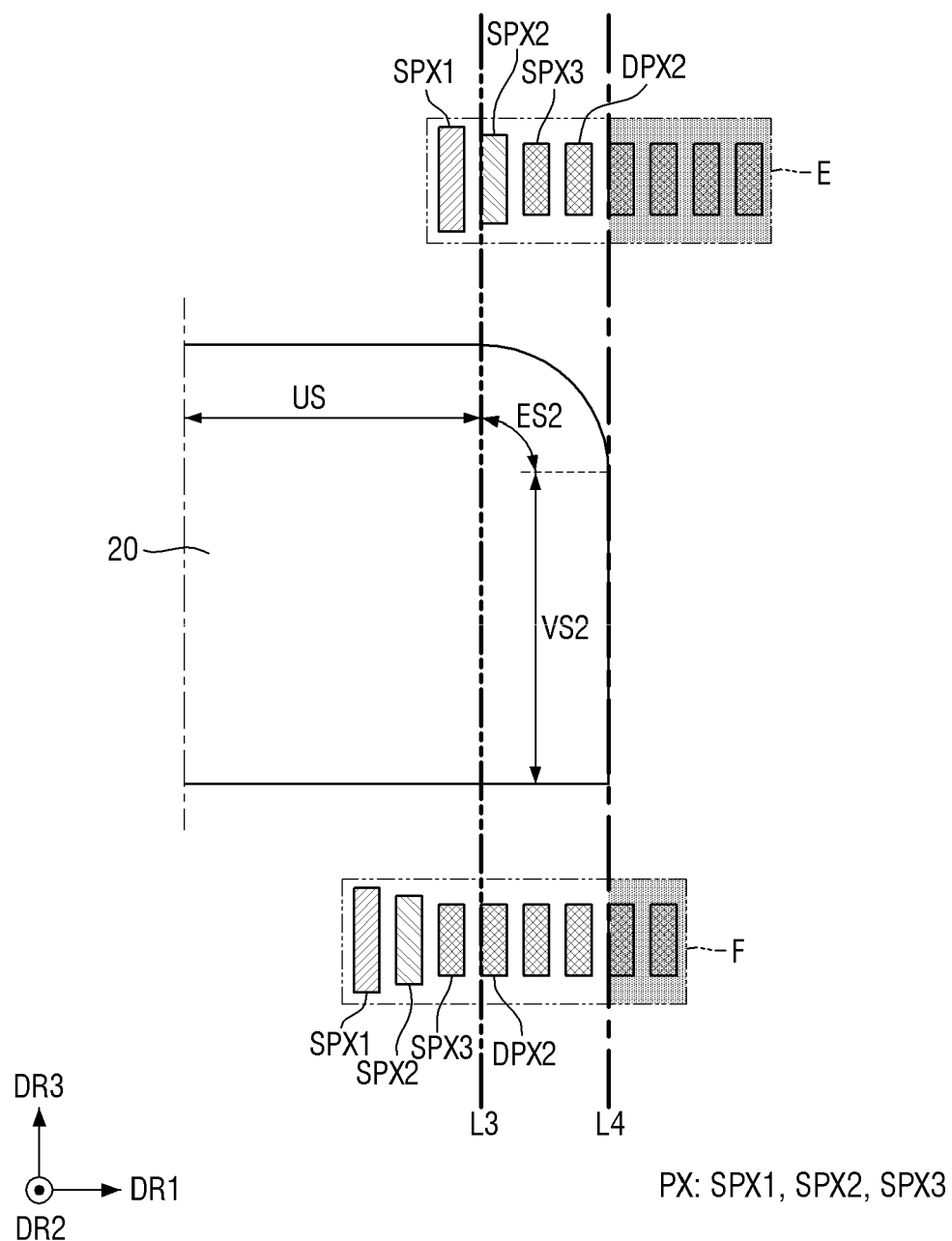
FIG. 16 is a view schematically showing the relationship between areas E and F of FIG. 14 and the bottom plate.
Figure 17:
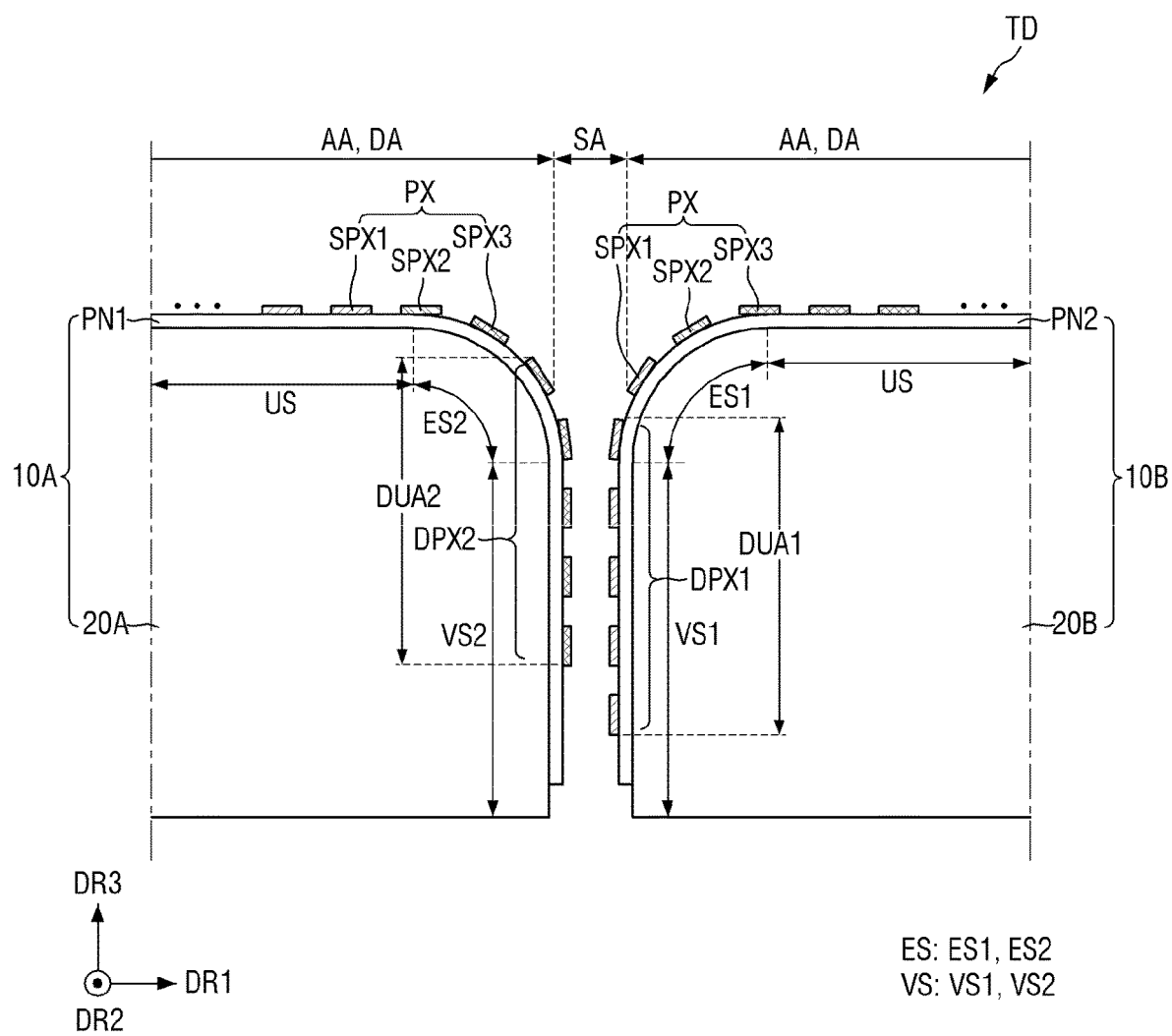
FIG. 17 is a cross-sectional view showing a boundary area of a tiled display according to one or more embodiments of the present disclosure.

FIG. 14 is a plan view showing a display panel according to one or more embodiments of the present disclosure. FIG. 15 is a view schematically showing the relationship between areas C and D of FIG. 14 and the bottom plate. FIG. 16 is a view schematically showing the relationship between areas E and F of FIG. 14 and the bottom plate. FIG. 17 is a cross-sectional view showing a boundary area of a tiled display according to one or more embodiments.

The embodiment of FIGS. 14 to 17 is different from the embodiments of FIGS. 3 and 13 in that the number of dummy pixels DPX1 and DPX2 disposed on the side surface VS of the bottom plate 20 differs at different positions of each of the dummy areas DUA1 and DUA2.

For example, the display panel PN may be disposed on the bottom plate 20 and may be coupled with the upper surface US, the edge surfaces ES1 and ES2 and the side surfaces VS1 and VS2 of the bottom plate 20. The display panel PN may start to bend at a first line L1 where the upper surface US and the first edge surface ES1 of the bottom plate 20 meet, and may be flatly extended in the direction perpendicular to the upper surface US at a second line L2 where the first edge surface ES1 and the first side surface VS1 of the bottom plate 20 meet. In addition, the display panel PN may start to bend at a third line L3 where the upper surface US and the second edge surface ES2 of the bottom plate 20 meet, and may be flatly extended in the direction perpendicular to the upper surface US at a fourth line L4 where the first edge surface ES1 and the first side surface VS1 of the bottom plate 20 meet.

The display panel PN1 may include a first area C located on one side of the first dummy area DUA1 in the second direction DR2 and a second area D located on the opposite side of the first dummy area DUA1 in the second direction DR2, and a third area E located on one side of the second dummy area DUA2 in the second direction DR2 and a fourth area F located on the opposite side of the second dummy area DUA2 in the second direction DR2. Each of the first area C and the second area D may include at least one pixel PX and a plurality of first dummy pixels DPX1, and each of the third area E and the fourth area F may include at least one pixel PX and a plurality of second dummy pixels DPX2.

In the first area C, the first to third sub-pixels SPX1, SPX2 and SPX3 of the active area AA may overlap the upper surface US of the bottom plate 20 in the third direction DR3. Some of the plurality of first dummy pixels DPX1 in the first dummy area DUA1 may overlap the first edge surface ES1 of the bottom plate 20 in the third direction DR3, and the other first dummy pixels DPX1 may overlap the first side surface VS1 of the bottom plate 20 in the first direction DR1.

In one or more embodiments, three first dummy pixels DPX1 out of five first dummy pixels DPX1 disposed in the first dummy area DUA1 may overlap the first edge surface ES1 of the bottom plate 20, while the other two first dummy pixels DPX1 may overlap the first side surface VS1 of the bottom plate 20. On the other hand, the first to third sub-pixels SPX1, SPX2 and SPX3 of the active area AA may overlap the upper surface US of the bottom plate 20, but may not overlap the first edge surface ES1 or the first side surface VS1.

In the second area D, some of the first to third sub-pixels SPX1, SPX2, and SPX3 of the active area AA may overlap the upper surface US of the bottom plate 20 in the third direction DR3, while some other sub-pixels may overlap the first edge surface ES1 of the bottom plate 20 in the third direction DR3. In one or more embodiments, some of the plurality of first dummy pixels DPX1 in the first dummy area DUA1 may overlap the first edge surface ES1 of the bottom plate 20 in the third direction DR3, and the other first dummy pixels DPX1 may overlap the first side surface VS1 of the bottom plate 20 in the first direction DR1.

In one or more embodiments, one first dummy pixels DPX1 out of five first dummy pixels DPX1 disposed in the first dummy area DUA1 may overlap the first edge surface ES1 of the bottom plate 20, while the other four first dummy pixels DPX1 may overlap the first side surface VS1 of the bottom plate 20. The third sub-pixel SPX3 among the first to third sub-pixels SPX1, SPX2, and SPX3 of the active area AA may overlap the upper surface US of the bottom plate 20, while the first and second sub-pixels SPX1 and SPX2 may overlap the first edge surface ES1.

In the third area E, some of the first to third sub-pixels SPX1, SPX2, and SPX3 of the active area AA may overlap the upper surface US of the bottom plate 20 in the third direction DR3, while some other sub-pixels may overlap the second edge surface ES2 of the bottom plate 20 in the third direction DR3. Some of the plurality of second dummy pixels DPX2 in the second dummy area DUA2 may overlap the second edge surface ES2 of the bottom plate 20 in the third direction DR3, and the other second dummy pixels DPX2 may overlap the second side surface VS2 of the bottom plate 20 in the first direction DR1.

In one or more embodiments, one second dummy pixels DPX2 out of five second dummy pixels DPX2 disposed in the second dummy area DUA2 may overlap the second edge surface ES2 of the bottom plate 20, while the other four second dummy pixels DPX2 may overlap the second side surface VS2 of the bottom plate 20. The first sub-pixel SPX1 among the first to third sub-pixels SPX1, SPX2 and SPX3 of the active area AA may overlap the upper surface US of the bottom plate 20, while the second and third sub-pixels SPX2 and SPX3 may overlap the second edge surface ES2.

In the fourth area F, the first to third sub-pixels SPX1, SPX2, and SPX3 of the active area AA may overlap the upper surface US of the bottom plate 20 in the third direction DR3. Some of the plurality of second dummy pixels DPX2 in the second dummy area DUA2 may overlap the second edge surface ES2 of the bottom plate 20 in the third direction DR3, and the other second dummy pixels DPX2 may overlap the second side surface VS2 of the bottom plate 20 in the first direction DR1.

In one or more embodiments, three second dummy pixels DPX2 out of five second dummy pixels DPX2 disposed in the second dummy area DUA2 may overlap the second edge surface ES2 of the bottom plate 20, while the other two second dummy pixels DPX2 may overlap the second side surface VS2 of the bottom plate 20. On the other hand, the first to third sub-pixels SPX1, SPX2 and SPX3 of the active area AA may overlap the upper surface US of the bottom plate 20, but may not overlap the second edge surface ES2 or the second side surface VS2.

In addition, the number of the first dummy pixels DPX1 disposed on the first side surface VS1 in the first area C among the first dummy pixels DPX1 in the first dummy area DUA1 may be different from the number of the second dummy pixels DPX2 disposed on the second side surface VS2 in the third area E among the second dummy pixels DPX2 in the second dummy area DUA2 disposed in the same first direction DR1.

In the above-described structure, when the dummy pixels DPX1 and DPX2 disposed in each of the first to fourth areas C, D, E, and F receive the same voltage to emit light, they may have different luminances. For example, the luminance of the light output from the two first dummy pixels DPX1 overlapping the first side surface VS1 in the first area C may become different from the luminance of the light output from the four first dummy pixels DPX1 overlapping the first side surface VS1 in the second area D. That is to say, the number of first dummy pixels DPX1 disposed on the first side surface VS1 in the first area C is different from the number of the first dummy pixels DPX1 disposed on the first side surface VS1 in the second area D, and thus there is a difference in luminance.

According to the illustrated embodiments, it is possible to balance the luminance between the active area AA and the dummy areas DUA1 and DUA2 by way of making the luminance uniform by performing the above-described luminance correction, which may otherwise become different depending on the number of dummy pixels disposed on the side surfaces VS1 and VS2 of the bottom plate 20. In this manner, the display quality of the display device 10 may be improved.

As shown in FIG. 17, the plurality of display devices 10A and 10B thus configured may be disposed adjacent to each other to form a large screen of the tiled display TD. The first display device 10A and the second display device 10B may face each other at the boundary area SA. As described above with reference to FIGS. 14 to 16, when the number of dummy pixels DPX1 and DPX2 disposed on the side surface VS of the bottom plate 20 differs at different positions in each of the dummy areas DUA1 and DUA2, the pixels PX and the dummy pixels DPX1 and DPX2 of each of the display panels PN1 and PN2 may be arranged asymmetrical to each other.

For example, the plurality of second dummy pixels DPX2 of the first display panel PN1 may be disposed to face the first side surface VS1 of the second display panel PN2. The plurality of first dummy pixels DPX1 of the second display panel PN2 may be disposed to face the second side surface VS2 of the first display panel PN1. In this instance, some of the plurality of first dummy pixels DPX1 of the second display panel PN2 may not overlap the plurality of second dummy pixels DPX2 of the first display panel PN1 in the first direction DR1. That is to say, the number of second dummy pixels DPX2 disposed on the second side surface VS2 of the first bottom plate 20A may be different from the number of the first dummy pixels DPX1 disposed on the first side surface VS1 of the second bottom plate 20B.

According to the illustrated embodiments, the numbers of dummy pixels DPX of the display panels PN1 and PN2 disposed at the boundary area SA of the tiled display TD, for example, the number of the second dummy pixels DPX2 disposed on the second side surface VS2 and the second edge ES2 of the first display panel PN1 and the number of first dummy pixels DPX1 disposed on the first side surface VS1 and the first edge ES1 of the second display panel PN2 may be different from each other. In this instance, by performing the above-described luminance correction, taking the numbers of the dummy pixels DPX1 and DPX2 on the edge surfaces ES1 and ES2 as well as the side surfaces VS1 and VS2 into account, the luminance may be balanced at the boundary area SA, and also between the boundary area SA and the display area DA. In this manner, the boundary area SA is less noticeable in the tiled display TD to allow a viewer to get immersed into the images, and the display quality may be improved.

Figure 18:
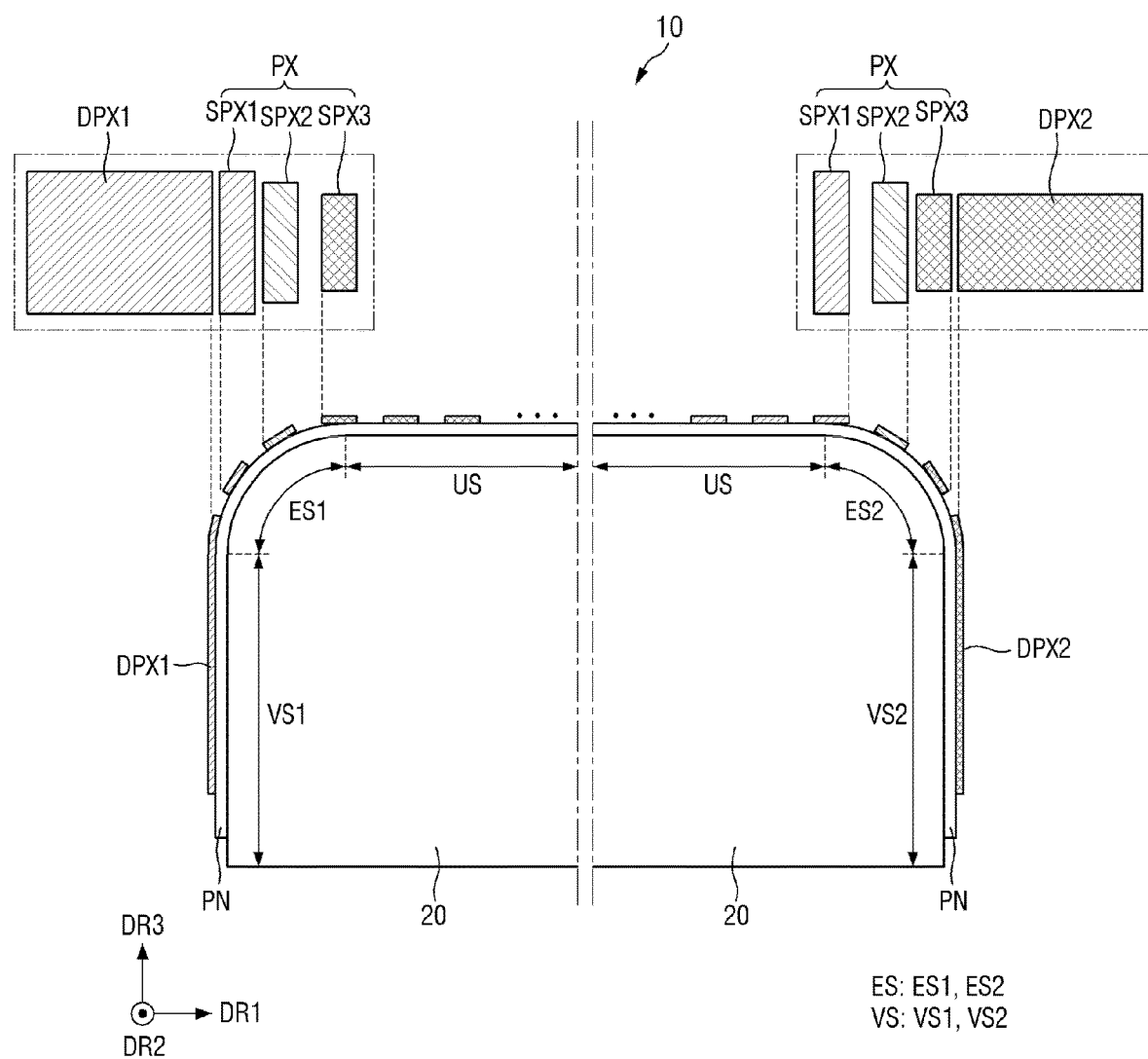
FIG. 18 is a cross-sectional view showing a display device according to one or more embodiments of the present disclosure.
Figure 19:
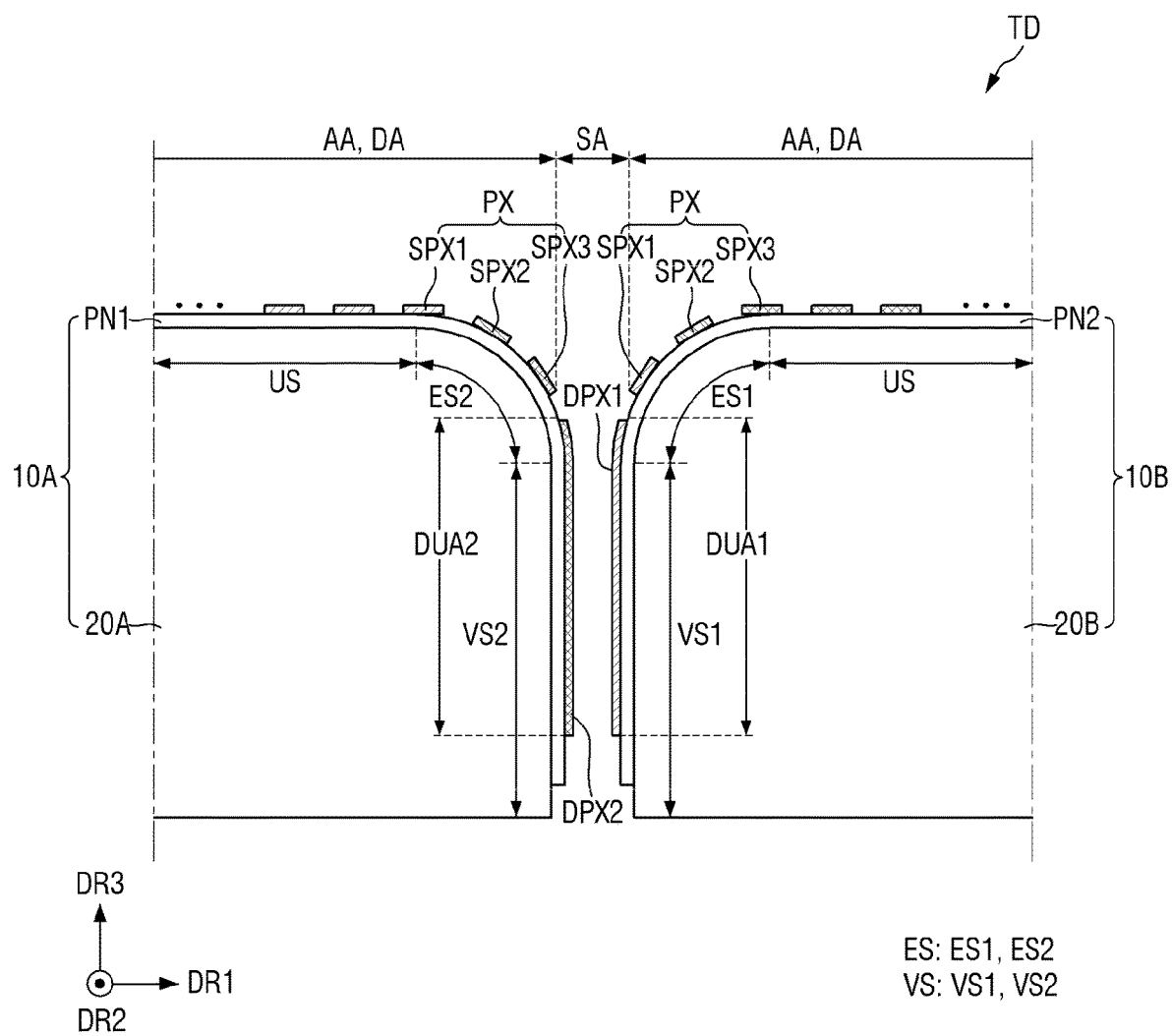
FIG. 19 is a cross-sectional view showing a tiled display according to one or more embodiments of the present disclosure.

FIG. 18 is a cross-sectional view showing a display device according to one or more embodiments of the present disclosure. FIG. 19 is a cross-sectional view showing a tiled display according to one or more embodiments of the present disclosure.

The embodiment of FIGS. 18 and 19 is different from the embodiments of FIGS. 3 to 17 in that each of dummy pixels DPX1 and DPX2 is formed as a single piece instead of a plurality of pieces.

Specifically, each of the dummy pixels DPX1 and DPX2 overlapping a single pixel PX in the first direction DR1 may be formed as a single piece. The first dummy pixel DPX1 disposed in the first dummy area DUA1 may be disposed adjacent to the first sub-pixel SPX1. The first dummy pixel DPX1 may have a shape having the same length in the second direction DR2 as compared to the adjacent first sub-pixel SPX1 but having a greater width in the first direction DR1. In other words, the area of the first dummy pixel DPX1 may be larger than the area of the first sub-pixel SPX1 when viewed from the top.

On the bottom plate 20, at least one sub-pixel SPX of the pixels PX may be disposed on the first edge surface ES1, and the first dummy pixel DPX1 may be disposed on the first edge surface ES1 and the first side surface VS1. It should be understood, however, that the present disclosure is not limited thereto. The first dummy pixel DPX1 may be disposed on the first side surface VS1 but not on the first edge surface ES1.

In addition, the second dummy pixel DPX2 disposed in the second dummy area DUA2 may be disposed adjacent to the third sub-pixel SPX3. The second dummy pixel DPX2 may have a shape having the same length in the second direction DR2 as compared to the adjacent third sub-pixel SPX3 but having a greater width in the first direction DR1. In other words, the area of the second dummy pixel DPX2 may be larger than the area of the third sub-pixel SPX3 when viewed from the top.

On the bottom plate 20, at least one sub-pixel SPX of the pixels PX may be disposed on the second edge surface ES2, and the second dummy pixel DPX2 may be disposed on the second edge surface ES2 and the second side surface VS2. It should be understood, however, that the present disclosure is not limited thereto. The second dummy pixel DPX2 may be disposed on the second side surface VS2 but not on the second edge surface ES2.

According to the embodiments of FIGS. 18 and 19, the dummy pixels DPX1 and DPX2 have a large area, so that the light exit area may become further increased. Accordingly, high luminance can be achieved in each of the dummy pixels DPX1 and DPX2, and thus it is possible to prevent the border of the display panel PN from being noticed, and the boundary area SA from being seen in the tiled display TD.

Figure 20:
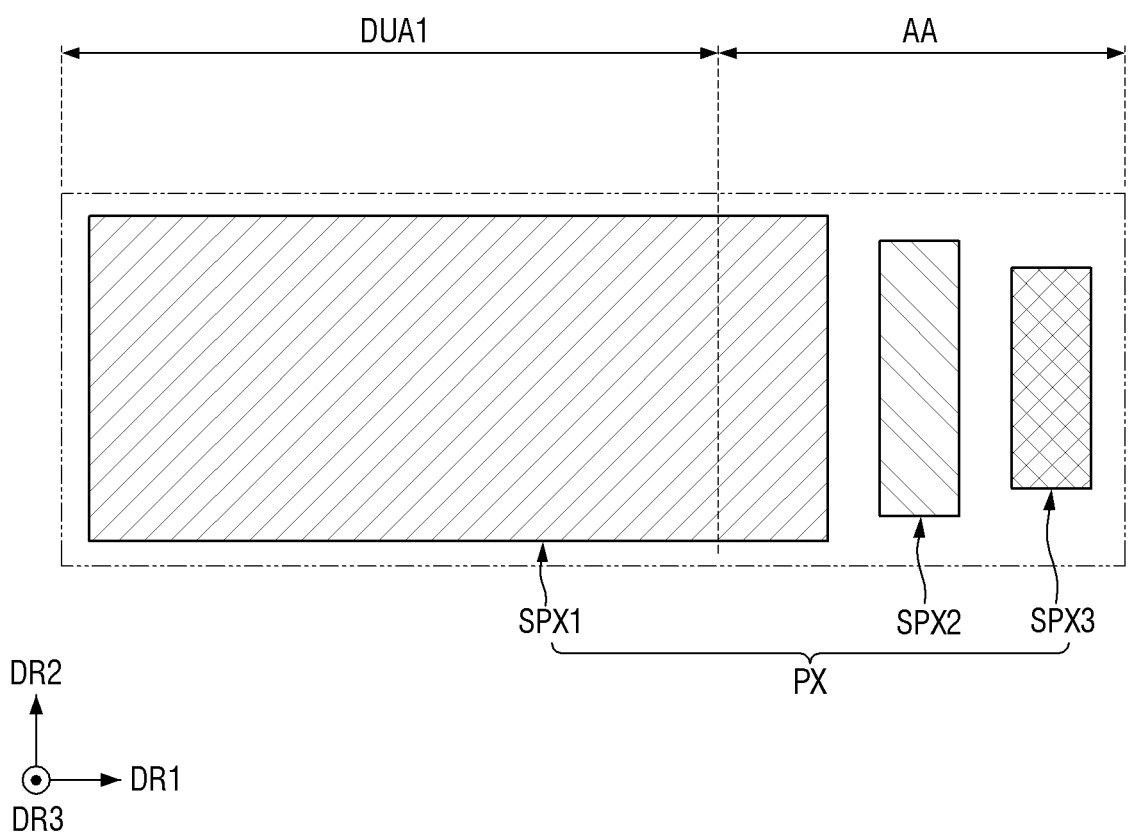
FIG. 20 is a plan view showing the area A of FIG. 3 according to one or more embodiments of the present disclosure.
Figure 21:
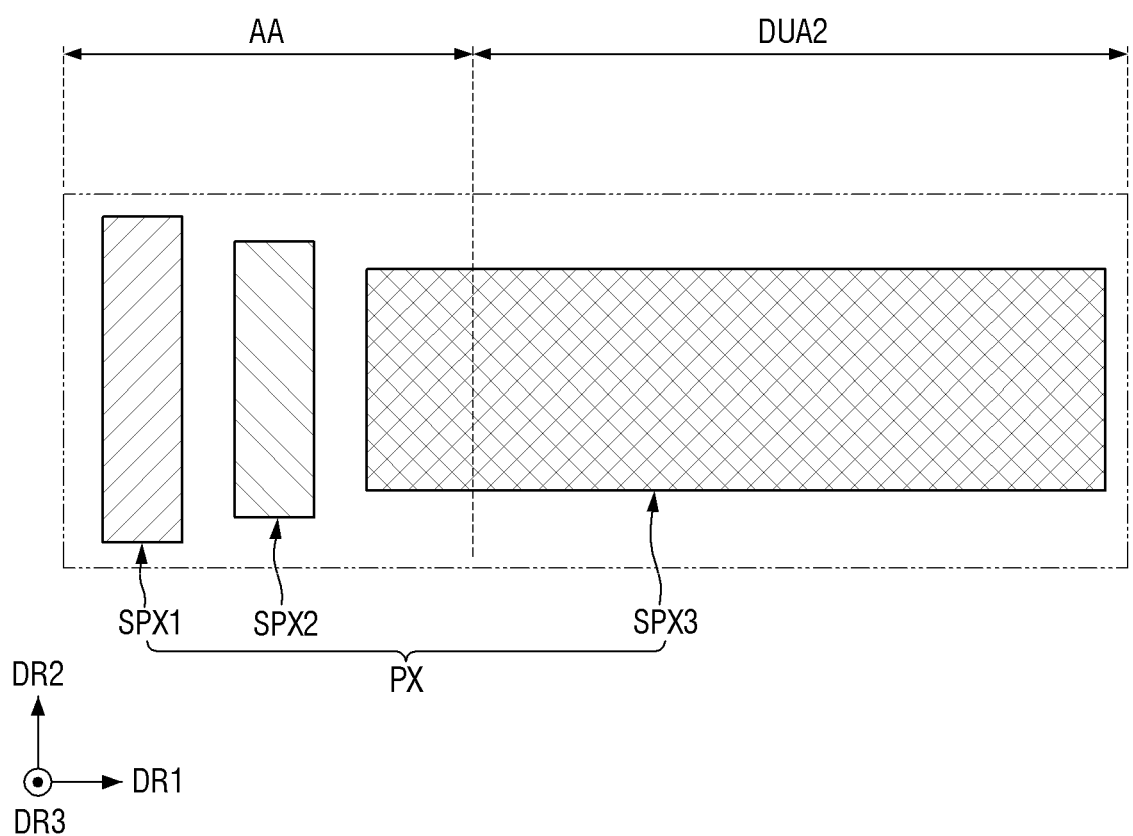
FIG. 21 is a plan view showing the area B of FIG. 3 according to one or more embodiments of the present disclosure.
Figure 22:
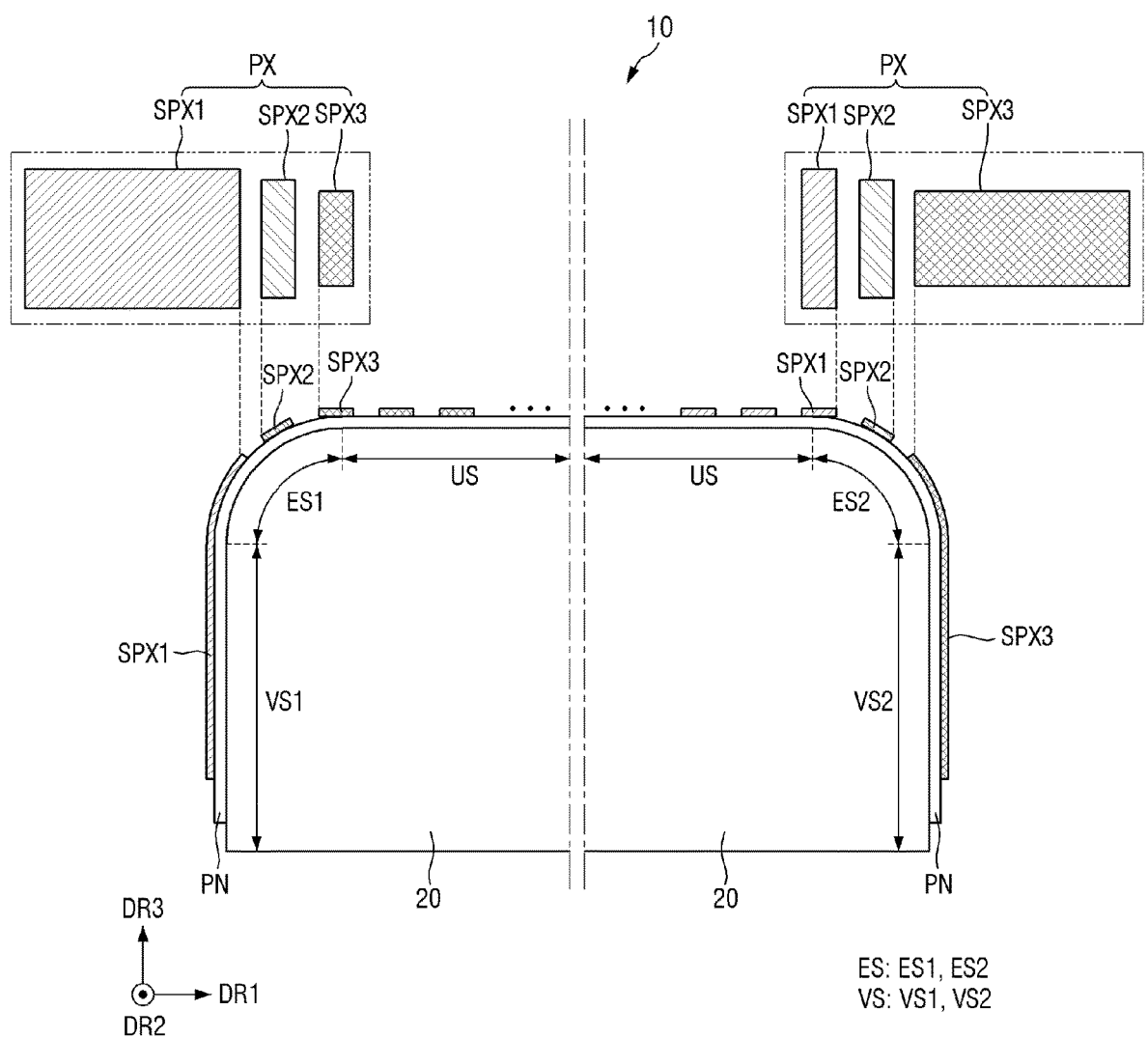
FIG. 22 is a cross-sectional view showing a tiled display according to one or more embodiments of the present disclosure.

FIG. 20 is a plan view showing the area A of FIG. 3 according to one or more embodiments of the present disclosure. FIG. 21 is a plan view showing the area B of FIG. 3 according to one or more embodiments of the present disclosure. FIG. 22 is a cross-sectional view showing a tiled display according to one or more embodiments of the present disclosure.

The embodiment of FIGS. 20 to 22 is different from the embodiments of FIGS. 3 to 19 in that sub-pixels adjacent to dummy areas DUA1 and DUA2 are extended to the dummy areas DUA1 and DUA2, respectively.

For example, a first sub-pixel SPX1 of a pixel PX adjacent to the first dummy area DUA1, which is closest to the first dummy area DUA1, may be extended to the first dummy area DUA1. The width of the first sub-pixel SPX1 in the first direction DR1 may be greater than the width of the second and third sub-pixels SPX2 and SPX3 in the first direction DR1. In addition, the length of the first sub-pixel SPX1 in the second direction DR2 may be greater than the lengths of the second and third sub-pixels SPX2 and SPX3 in the second direction DR2.

At least one sub-pixel SPX of the pixels PX may be disposed on the first edge surface ES1 and the first side surface VS1 on the bottom plate 20. For example, the first sub-pixel SPX1 may be disposed on the first edge surface ES1 and the first side surface VS1 of the bottom plate 20. It should be understood, however, that the present disclosure is not limited thereto. The first sub-pixel SPX1 may also be disposed on the upper surface US of the bottom plate 20.

A third sub-pixel SPX3 of a pixel PX adjacent to the second dummy area DUA2, which is closest to the third dummy area DUA3, may be extended to the second dummy area DUA2. The width of the third sub-pixel SPX3 in the first direction DR1 may be greater than the width of the first and second sub-pixels SPX1 and SPX2 in the first direction DR1. In addition, the length of the third sub-pixel SPX3 in the second direction DR2 may be smaller than the lengths of the first and second sub-pixels SPX1 and SPX2 in the second direction DR2.

At least one sub-pixel SPX of the pixels PX may be disposed on the second edge surface ES2 and the second side surface VS2 on the bottom plate 20. For example, the third sub-pixel SPX3 may be disposed on the second edge surface ES2 and the second side surface VS2 of the bottom plate 20. It should be understood, however, that the present disclosure is not limited thereto. The third sub-pixel SPX3 may also be disposed on the upper surface US of the bottom plate 20.

According to the embodiment of FIGS. 20-22, dummy pixels are eliminated and instead the sub-pixels are extended to the dummy areas DUA1 and DUA2, so that the light exit area may be further increased. Accordingly, it is possible to prevent the border of the display panel PN from being seen, and to prevent the boundary area SA from being seen in the tiled display TD.

Figure 23:
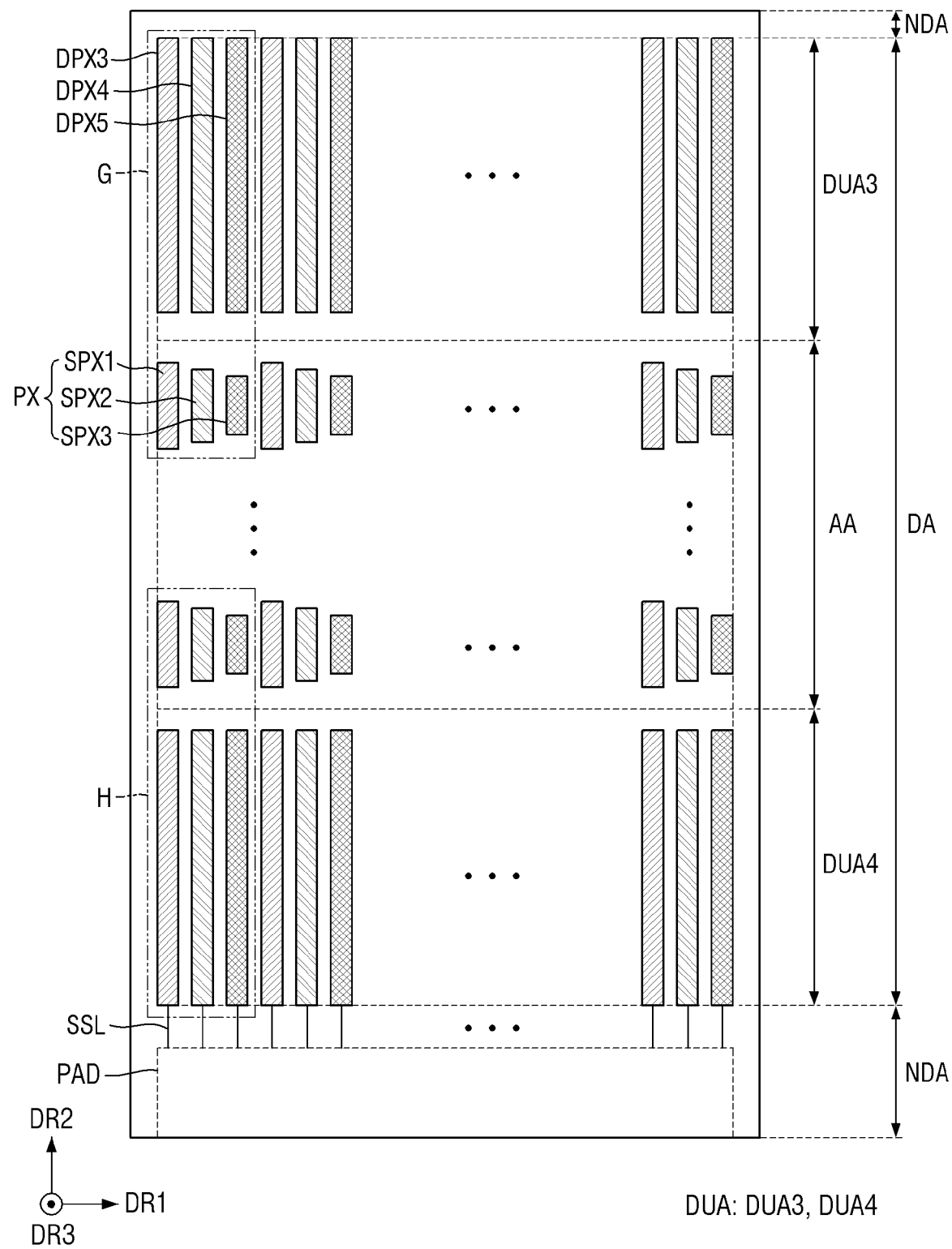
FIG. 23 is a plan view showing a display panel of a display device according to one or more embodiments of the present disclosure.
Figure 24:
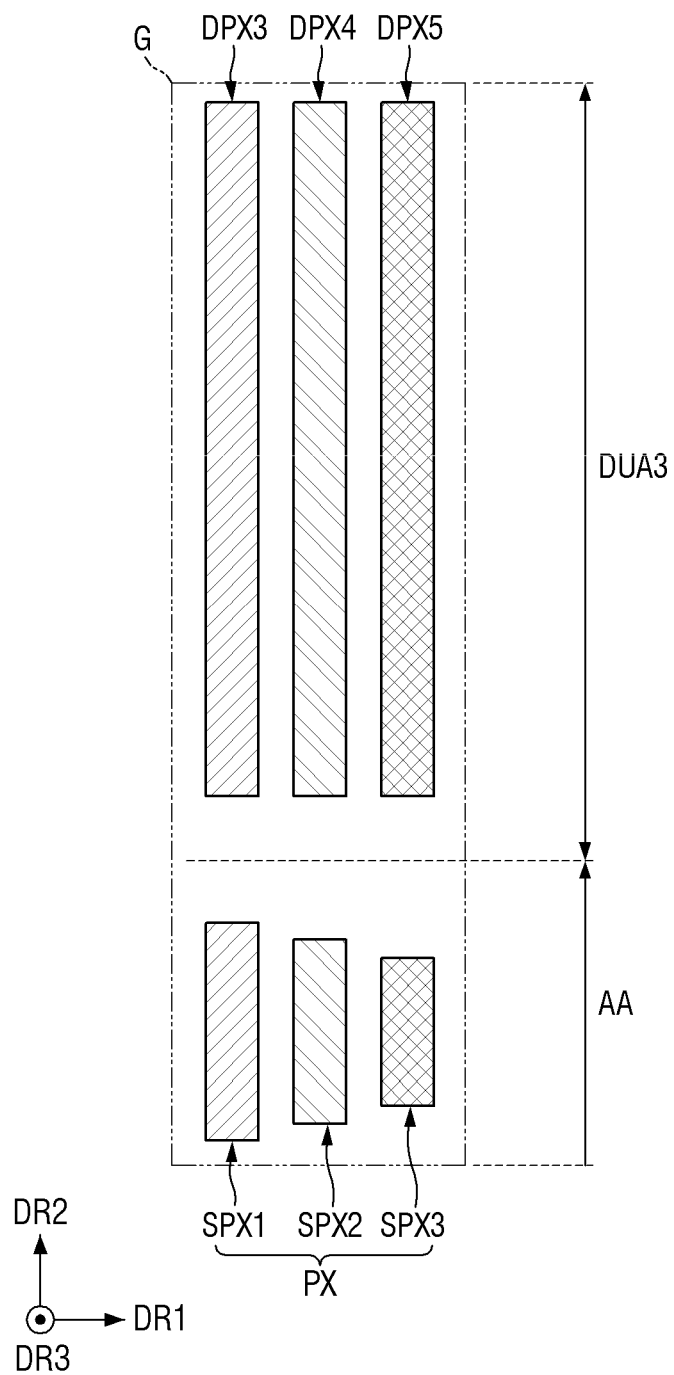
FIG. 24 is a plan view showing an area G of FIG. 23.
Figure 25:
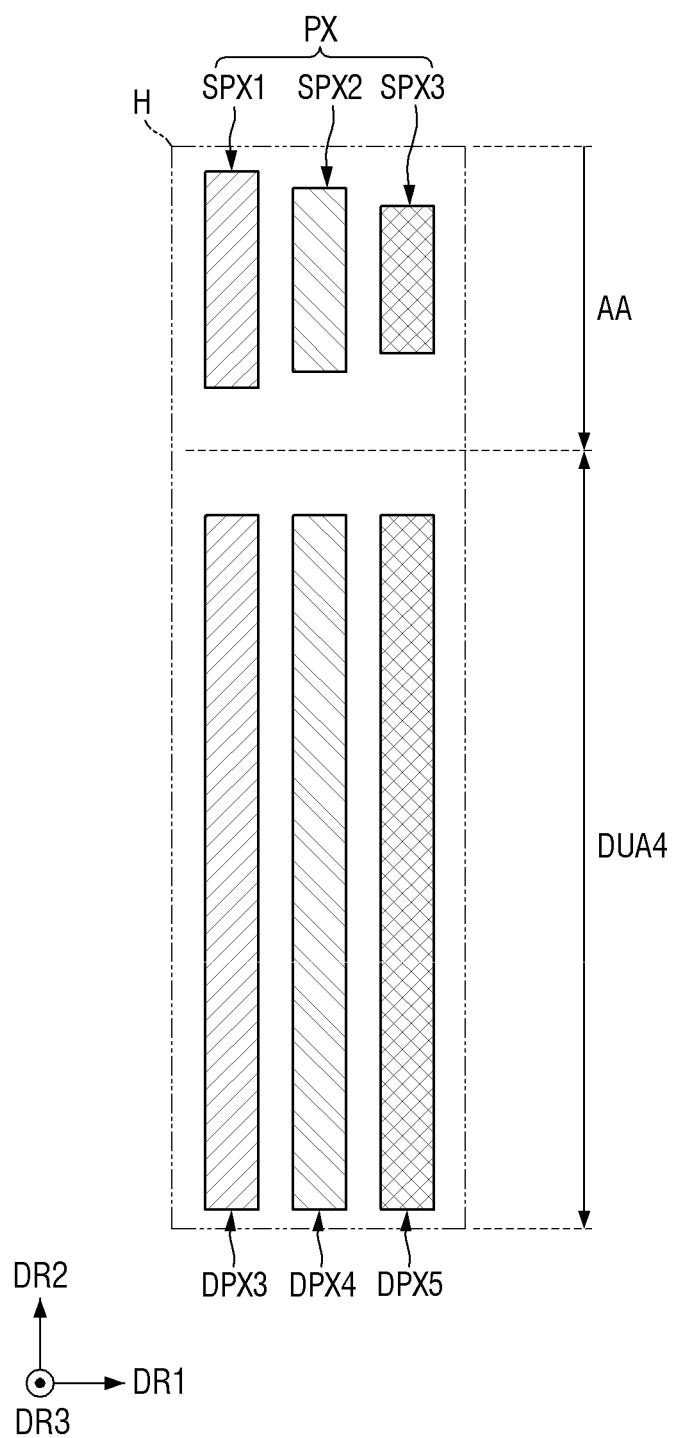
FIG. 25 is a plan view showing an area H of FIG. 23.
Figure 26:
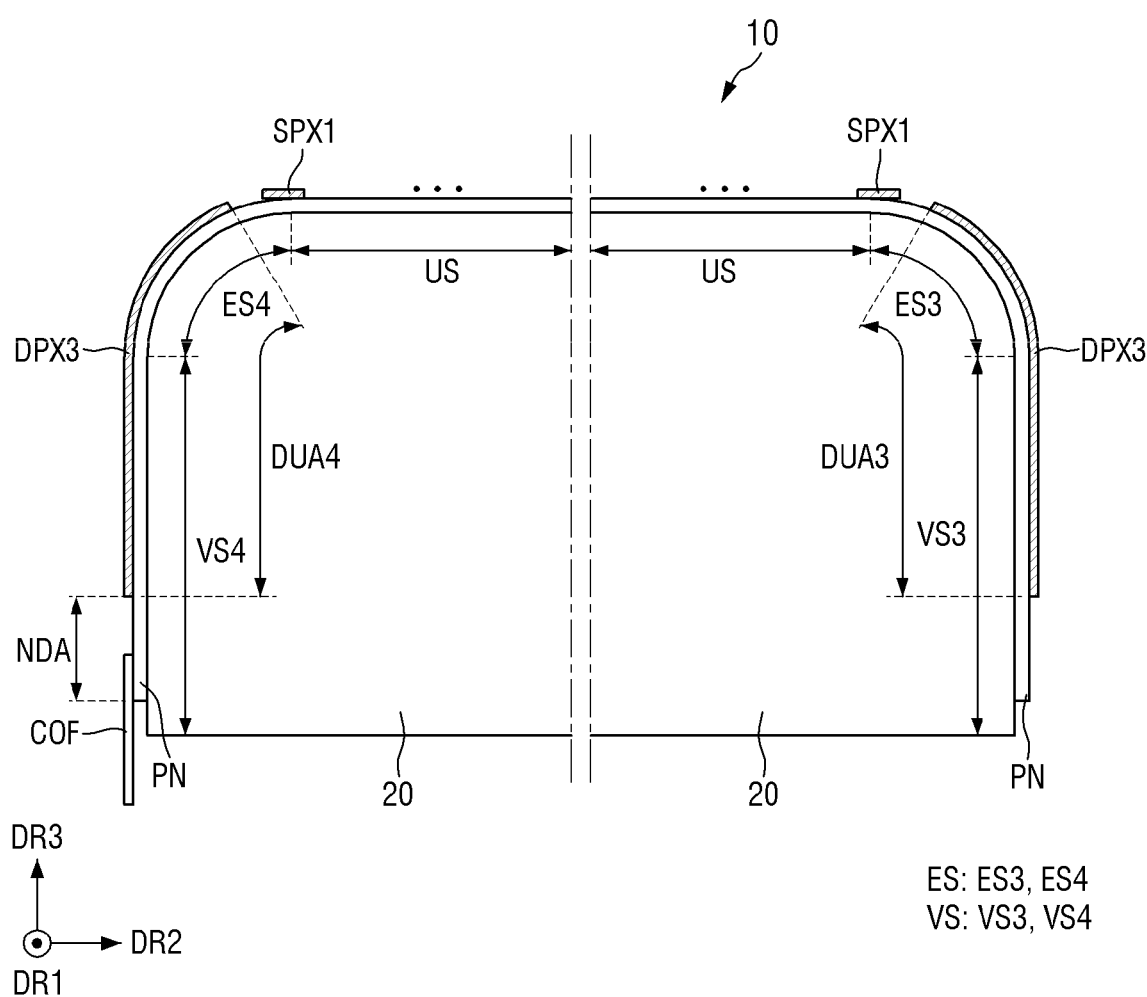
FIG. 26 is a cross-sectional view showing a tiled display according to one or more embodiments of the present disclosure.

FIG. 23 is a plan view showing a display panel of a display device according to one or more embodiments of the present disclosure. FIG. 24 is a plan view showing an area G of FIG. 23. FIG. 25 is a plan view showing an area H of FIG. 23. FIG. 26 is a cross-sectional view showing a tiled display according to one or more embodiments of the present disclosure.

The embodiment of FIGS. 23 to 26 is different from the above-described embodiments of FIGS. 3 to 22 in that dummy areas DUA3 and DUA4 are located on the upper side and the lower side of the display panel PN, and a plurality of dummy pixels is included in each of the dummy areas DUA3 and DUA4.

For example, the display panel PN may include a third dummy area DUA3 located on a side of the active area AA of the display area DA in the second direction DR2, and a fourth dummy area DUA4 located on the opposite side of the active area AA in the second direction DR2.

Each of the third dummy area DUA3 and the fourth dummy area DUA4 may include a plurality of third dummy pixels DPX3, a plurality of fourth dummy pixels DPX4 and a plurality of fifth dummy pixels DPX5 arranged along the first direction DR1. The third dummy pixel DPX3, the fourth dummy pixel DPX4, and the fifth dummy pixel DPX5 may be arranged in this order repeatedly.

The plurality of third dummy pixels DPX3 may be disposed to overlap with the plurality of first sub-pixels SPX1 in the second direction DR2, and may emit light of the same color as that of the first sub-pixel SPX1. The plurality of fourth dummy pixels DPX4 may be disposed to overlap with the plurality of second sub-pixels SPX2 in the second direction DR2, and may emit light of the same color as that of the second sub-pixel SPX2. The plurality of fifth dummy pixels DPX5 may be disposed to overlap with the plurality of third sub-pixels SPX3 in the second direction DR2, and may emit light of the same color as that of the third sub-pixel SPX3.

The plurality of third dummy pixels DPX3, the plurality of fourth dummy pixels DPX4, and the plurality of fifth dummy pixels DPX5 may have the same length in the second direction DR2, and may have the same width in the first direction DR1. It should be understood, however, that the present disclosure is not limited thereto. The plurality of third dummy pixels DPX3, the plurality of fourth dummy pixels DPX4, and the plurality of fifth dummy pixels DPX5 may have different lengths in the second direction DR2, and may have different widths in the first direction DR1.

The display panel PN as described above may be coupled to and disposed on the bottom plate 20. The bottom plate 20 may include an upper surface US, a third side surface VS3, a fourth side surface VS4, a third edge surface ES3, and a fourth edge surface ES4. The third side surface VS3 may correspond to the third dummy area DUA3, and the fourth side surface VS4 may correspond to the fourth dummy area DUA4. The third edge surface ES3 may connect the upper surface US with the third side surface VS3, and the fourth edge surface ES4 may connect the upper surface US with the fourth side surface VS4.

The plurality of third dummy pixels DPX3, the plurality of fourth dummy pixels DPX4, and the plurality of fifth dummy pixels DPX5 disposed in the third dummy area DUA3 of the display panel PN may be disposed on the third edge surface ES3 and the third side surface VS3 of the bottom plate 20. The plurality of third dummy pixels DPX3, the plurality of fourth dummy pixels DPX4, and the plurality of fifth dummy pixels DPX5 disposed in the fourth dummy area DUA4 of the display panel PN may be disposed on the fourth edge surface ES4 and the fourth side surface VS4 of the bottom plate 20. The plurality of pixels PX may be disposed on the active area AA and may not overlap the third edge surface ES3, the fourth edge surface ES4, the third side surface VS3, and the fourth side surface VS4.

For example, the plurality of third dummy pixels DPX3, the plurality of fourth dummy pixels DPX4, and the plurality of fifth dummy pixels DPX5 disposed in the fourth dummy area DUA4 may be disposed adjacent to a chip-on-film COF attached to the non-display area NDA of the display panel PN. In the non-display area NDA between the plurality of third dummy pixels DPX3, the plurality of fourth dummy pixels DPX4 and the plurality of fifth dummy pixels DPX5 and the chip-on-film COF, the plurality of signal lines SSL and fan-out lines may be disposed.

According to the embodiment of FIGS. 23-26, the dummy areas DUA3 and DUA4 including a plurality of dummy pixels DPX3, DPX4, and DPX5 may be formed at the border of each of the display panel PN on the upper and lower sides of the display area DA, and a plurality of dummy pixels DPX3, DPX4, and DPX5 may be disposed on the edge surfaces ES3 and ES4 and the side surfaces VS3 and VS4 of the bottom plate 20. Accordingly, the dummy pixels DPX3, DPX4, and DPX5 emit light to prevent the border of the display panel PN from being noticed.

In addition, in the tiled display TD in which the above-described display devices 10 are disposed, the boundary area SA is less noticeable in displaying a single image. As a result, the display quality of the tiled display TD can be improved.

Figure 27:
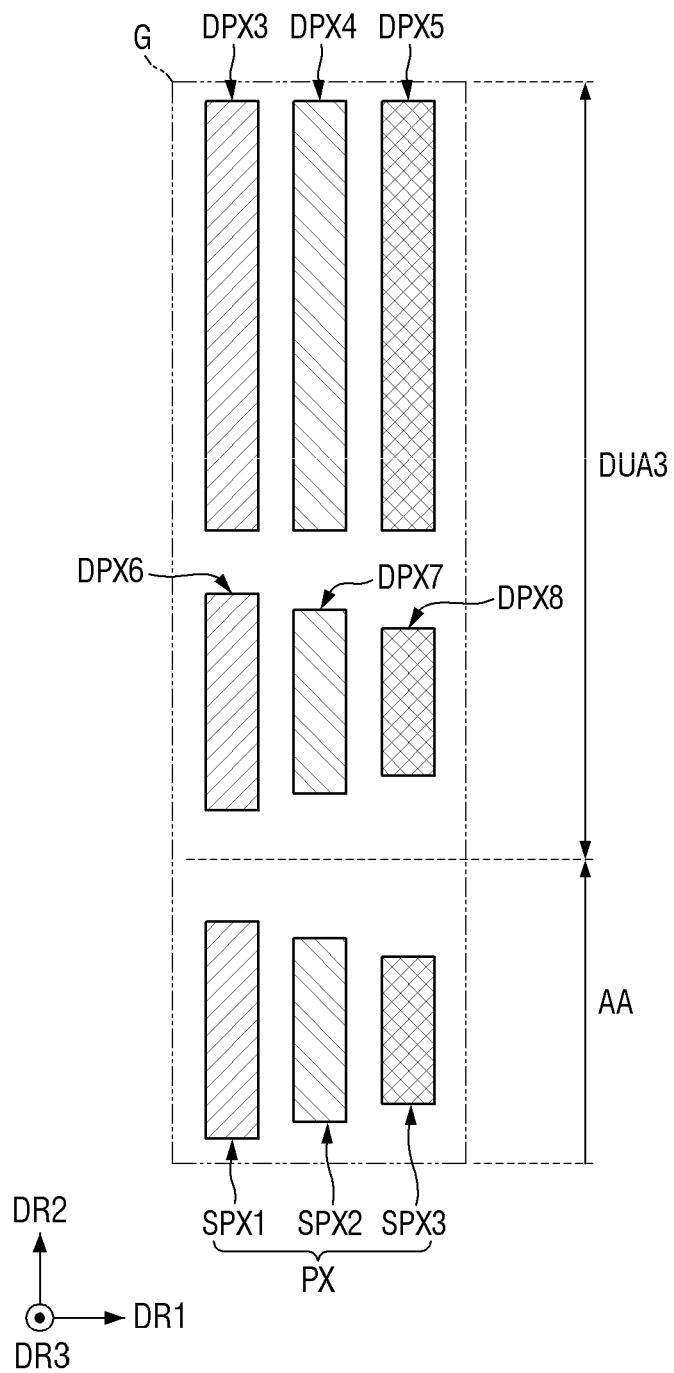
FIG. 27 is a plan view showing the area G of FIG. 23 according to one or more embodiments of the present disclosure.
Figure 28:
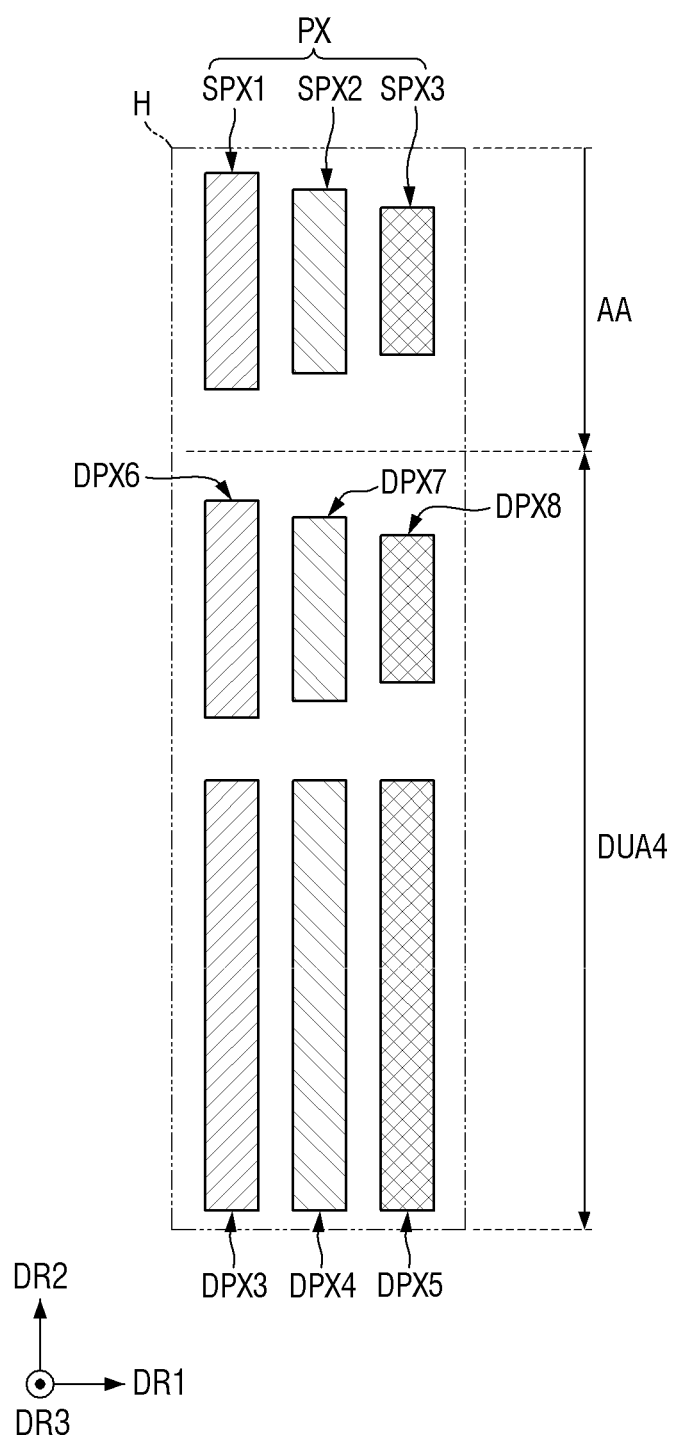
FIG. 28 is a plan view showing the area H of FIG. 23 according to one or more embodiments of the present disclosure.

FIG. 27 is a plan view showing the area G of FIG. 23 according to one or more embodiments of the present disclosure. FIG. 28 is a plan view showing the area H of FIG. 23 according to one or more embodiments of the present disclosure.

The embodiment of FIGS. 27 and 28 is different from the embodiment of FIGS. 23 to 26 in that a plurality of dummy pixels DPX6, DPX7, and DPX8 are further disposed in each of dummy areas DUA3 and DUA4. Although FIGS. 27 and 28 show only area G and area H of FIG. 23, the following description may be equally applied to the entire dummy areas DUA3 and DUA4.

For example, each of the third dummy area DUA3 and the fourth dummy area DUA4 may further include a plurality of sixth dummy pixels DPX6, a plurality of seventh dummy pixels DPX7, and a plurality of eighth dummy pixels DPX8 arranged along the first direction DR1. The sixth dummy pixel DPX6, the seventh dummy pixel DPX7, and the eighth dummy pixel DPX8 may be arranged in this order repeatedly.

The plurality of sixth dummy pixels DPX6 may be disposed between the plurality of first sub-pixels SPX1 and the third dummy pixels DPX3 to overlap with them in the second direction DR2, and may emit light of the same color as that of the first sub-pixels SPX1. The plurality of seventh dummy pixels DPX7 may be disposed between the plurality of second sub-pixels SPX2 and the fourth dummy pixels DPX4 to overlap with them in the second direction DR2, and may emit light of the same color as that of the second sub-pixels SPX2. The plurality of eighth dummy pixels DPX8 may be disposed between the plurality of third sub-pixels SPX3 and the fifth dummy pixels DPX5 to overlap with them in the second direction DR2, and may emit light of the same color as that of the third sub-pixels SPX3.

The plurality of sixth dummy pixels DPX6, the plurality of seventh dummy pixels DPX7, and the plurality of eighth dummy pixels DPX8 may have different lengths in the second direction DR2, and may have the same width in the first direction DR1. The plurality of sixth dummy pixels DPX6 may have the same planar area and shape as the first sub-pixels SPX1, the plurality of seventh dummy pixels DPX7 may have the same planar area and shape as the second sub-pixels SPX2, and the plurality of eighth dummy pixels DPX8 may have the same planar area and shape as the third sub-pixels SPX3. In addition, the plurality of sixth dummy pixels DPX6 may have a length in the second direction DR2 that is smaller than that of the third dummy pixel DPX3, the plurality of seventh dummy pixels DPX7 may have a length that is smaller than that of the fourth dummy pixel DPX4, and the plurality of eighth dummy pixels DPX8 may have a length that is smaller than that of the fifth dummy pixel DPX5.

It should be understood, however, that the present disclosure is not limited thereto. The plurality of sixth dummy pixels DPX6, the plurality of seventh dummy pixels DPX7 and the plurality of eighth dummy pixels DPX8 may have the same length, planar area, and shape. In addition, the plurality of sixth dummy pixels DPX6 may have different planar area and shape from those of the first sub-pixels SPX1, the plurality of seventh dummy pixels DPX7 may have different planar area and shape from the second sub-pixels SPX2, and the plurality of eighth dummy pixels DPX8 may have different planar area and shape from the third sub-pixels SPX3.

According to the embodiment of FIGS. 27 and 28, dummy pixels emitting light of the same color are further included in the dummy pixels disposed in the dummy areas DUA3 and DUA4, it is possible to adjust the luminance at the dummy areas DUA3 and DUA3 more precisely.

Although the display device including the first and second dummy areas and the display device including the third and fourth dummy areas have been separately described above, the present disclosure is not limited thereto. A display device may include all of first to fourth dummy areas.

In concluding the detailed description, those skilled in the art will appreciate that many variations and modifications can be made to the described embodiments without substantially departing from the principles and scope of the present disclosure. Therefore, the described embodiments of the present disclosure are used in a generic and descriptive sense only and not for purposes of limitation.

What is claimed is:

1. A display device comprising:
a bottom plate; and
a display panel comprising an active area on at least an upper surface of the bottom plate and comprising a plurality of pixels, and a plurality of dummy areas near the active area and comprising a plurality of dummy pixels,
wherein the plurality of dummy pixels is on at least one side surface of the bottom plate,
wherein the plurality of pixels comprises a first sub-pixel, a second sub-pixel, and a third sub-pixel configured to emit lights of different colors, and
wherein the plurality of dummy pixels is configured to emit light of a same color as one of the first sub-pixel, the second sub-pixel, and the third sub-pixel.

2. The display device of claim 1, wherein the plurality of dummy areas comprises a first dummy area at one side of the active area and a second dummy area at an opposite side of the active area,
wherein the first dummy area comprises a plurality of first dummy pixels from among the plurality of dummy pixels, and
wherein the second dummy area comprises a plurality of second dummy pixels from among the plurality of dummy pixels.

3. The display device of claim 2, wherein the plurality of first dummy pixels is adjacent to the first sub-pixel and configured to emit light of the same color as that of the first sub-pixel, and
wherein the plurality of second dummy pixels is adjacent to the third sub-pixel and configured to emit light of the same color as that of the third sub-pixel.

4. The display device of claim 3, wherein the plurality of first dummy pixels has a same shape and a same size as the first sub-pixel, and
wherein the plurality of second dummy pixels has a same shape and a same size as the third sub-pixel.

5. The display device of claim 3, wherein the first sub-pixel, the second sub-pixel, and the third sub-pixel are arranged along a first direction, and
wherein the plurality of first dummy pixels and the plurality of second dummy pixels are arranged along the first direction.

6. The display device of claim 2, wherein the bottom plate comprises the upper surface, a plurality of side surfaces, and a plurality of edge surfaces connecting the upper surface with the plurality of side surfaces,
wherein the plurality of side surfaces comprises a first side surface corresponding to the first dummy area and a second side surface corresponding to the second dummy area, and
wherein the plurality of edge surfaces comprises a first edge surface corresponding to the first dummy area and a second edge surface corresponding to the second dummy area.

7. The display device of claim 6, wherein the plurality of first dummy pixels is on the first edge surface and the first side surface, and
wherein the plurality of second dummy pixels is on the second edge surface and the second side surface.

8. The display device of claim 7, wherein the plurality of first dummy pixels and the plurality of second dummy pixels are arranged along a first direction, and
wherein a number of the plurality of first dummy pixels on the first side surface is different from a number of the plurality of second dummy pixels on the second side surface.

9. The display device of claim 7, wherein the plurality of first dummy pixels and the plurality of second dummy pixels are arranged along a first direction, and wherein a number of the plurality of first dummy pixels on the first side surface is equal to a number of the plurality of second dummy pixels on the second side surface.

10. A display device comprising:
a bottom plate; and
a display panel comprising an active area on at least an upper surface of the bottom plate and comprising a plurality of pixels, and a plurality of dummy areas near the active area and comprising a plurality of dummy pixels,
wherein the plurality of dummy pixels is on at least one side surface of the bottom plate,
wherein the plurality of pixels comprises a first sub-pixel, a second sub-pixel, and a third sub-pixel arranged along a first direction and configured to emit lights of different colors, and
wherein the plurality of dummy pixels comprises a first dummy pixel configured to emit light of a same color as the first sub-pixel, a second dummy pixel configured to emit light of a same color as the second sub-pixel, and a third dummy pixel configured to emit light of a same color as the third sub-pixel.

11. The display device of claim 10, wherein the display panel comprises a pad area on one side of the active area,
wherein the plurality of dummy areas comprises a first dummy area adjacent to the pad area with the active area therebetween and a second dummy area adjacent to the pad area, and
wherein the first dummy pixel, the second dummy pixel, and the third dummy pixel are located in each of the first dummy area and the second dummy area.

12. The display device of claim 10, wherein the first dummy pixel, the second dummy pixel, and the third dummy pixel extend in a second direction crossing the first direction and are sequentially arranged along the first direction.

13. The display device of claim 12, wherein a length of the first dummy pixel in the second direction is larger than a length of the first dummy pixel in the second direction, and
wherein a length of each of the second dummy pixel and the third dummy pixel in the second direction is equal to a length of the first dummy pixel in the second direction.

14. The display device of claim 10, further comprising:
a fourth dummy pixel between the first sub-pixel and the first dummy pixel;
a fifth dummy pixel between the second sub-pixel and the second dummy pixel; and
a sixth dummy pixel between the third sub-pixel and the third dummy pixel,
wherein the fourth dummy pixel has a same size and is configured to emit light of a same color as the first sub-pixel,
wherein the fifth dummy pixel has a same size and is configured to emit light of a same color as the second sub-pixel, and
wherein the sixth dummy pixel has a same size and is configured to emit light of a same color as the third sub-pixel.

15. A tiled display comprising:
a first display device and a second display device adjacent to each other, wherein each of the first display device and the second display device comprises:
a bottom plate; and
a display panel comprising an active area on the bottom plate and comprising a plurality of pixels, and a plurality of dummy areas near the active area and comprising a plurality of dummy pixels,
wherein the plurality of dummy pixels is on at least one side surface of the bottom plate,
wherein the plurality of pixels comprises a first sub-pixel, a second sub-pixel, and a third sub-pixel configured to emit lights of different colors, and
wherein the plurality of dummy pixels is configured to emit light of a same color as one of the first sub-pixel, the second sub-pixel, and the third sub-pixel.

16. The tiled display of claim 15, wherein the plurality of dummy areas comprises a first dummy area on one side of the active area and a second dummy area on an opposite side of the active area,
wherein the first dummy area comprises a plurality of first dummy pixels,
wherein the second dummy area comprises a plurality of second dummy pixels, and
wherein the plurality of second dummy pixels of the first display device faces the plurality of first dummy pixels of the second display device.

17. The tiled display of claim 16, further comprising:
a boundary area between the first display device and the second display device,
wherein the plurality of second dummy pixels of the first display device and the plurality of first dummy pixels of the second display device are adjacent to the boundary area.

18. The tiled display of claim 17, wherein the bottom plate comprises an upper surface, a plurality of side surfaces, and a plurality of edge surfaces connecting the upper surface with the plurality of side surfaces,
wherein the plurality of side surfaces comprises a first side surface corresponding to the first dummy area and a second side surface corresponding to the second dummy area,
wherein the plurality of edge surfaces comprises a first edge surface corresponding to the first dummy area and a second edge surface corresponding to the second dummy area, and
wherein the second side surface of the first display device and the first side surface of the second display device face each other in the boundary area.

19. The tiled display of claim 18, wherein the plurality of second dummy pixels is on the second edge surface and the second side surface in the first display device,
wherein the plurality of first dummy pixels is on the first edge surface and the first side surface in the second display device, and
wherein a number of the plurality of second dummy pixels of the first display device is equal to a number of the plurality of second dummy pixels of the first display device.

20. The tiled display of claim 19, wherein the plurality of second dummy pixels of the first display device is configured to emit light of a same color as that of the third sub-pixel, and
wherein the plurality of first dummy pixels of the second display device is configured to emit light of a same color as that of the first sub-pixels.

* * * * *